US010003407B2

United States Patent
Perez De Aranda Alonso et al.

(10) Patent No.: US 10,003,407 B2
(45) Date of Patent: Jun. 19, 2018

(54) TWO-LEVEL COSET CODING SCHEME FOR GIGABIT ETHERNET OVER PLASTIC OPTICAL FIBER

(71) Applicant: Knowledge Development for POF, S.L., Tres Cantos (ES)

(72) Inventors: Ruben Perez De Aranda Alonso, Tres Cantos (ES); David Ortiz, Tres Cantos (ES); Dunia Prieto, Tres Cantos (ES)

(73) Assignee: Knowledge Development for POF, S.L., Tres Cantos (ES)

( * ) Notice: Subject to any disclaimer, the term of this patent is extended or adjusted under 35 U.S.C. 154(b) by 0 days. days.

(21) Appl. No.: 14/994,675

(22) Filed: Jan. 13, 2016

(65) Prior Publication Data
US 2016/0204873 A1 Jul. 14, 2016

(30) Foreign Application Priority Data
Jan. 14, 2015 (EP) .................... 15382005

(51) Int. Cl.
*H04J 14/00* (2006.01)
*H04B 10/54* (2013.01)
(Continued)

(52) U.S. Cl.
CPC ........ *H04B 10/541* (2013.01); *H03M 13/251* (2013.01); *H03M 13/356* (2013.01);
(Continued)

(58) Field of Classification Search
CPC .......... H04B 10/541; H04B 10/2581; H04B 10/516; H03M 13/356; H03M 13/25;
(Continued)

(56) References Cited

U.S. PATENT DOCUMENTS

| 8,675,754 B1 | 3/2014 | Yonge, III et al. ........... 375/261 |
| 2012/0250785 A1 | 10/2012 | Vidal et al. .................. 375/295 |

FOREIGN PATENT DOCUMENTS

| EP | 2 498 432 | 9/2012 |
| JP | 2012-217151 | 11/2012 |

(Continued)

OTHER PUBLICATIONS

Pardo, "KDPOF, The Path to Gigabit POF", Program of Conference "19th International Conference on Plastic Optical Fibers (POF 2010)", Yokohama, Japan, Oct. 19-21, 2010.*
(Continued)

*Primary Examiner* — Juan A Torres
(74) *Attorney, Agent, or Firm* — Fattibene and Fattibene LLC; Paul A. Fattibene

(57) ABSTRACT

An efficient coding and modulation system for transmission of digital data over plastic optical fibers with low latency. In particular, the digital signal is coded by means of a two-level coset coding. The first level applies to the digital data a binary shortened BCH coding and performs coset partitioning by means of constellation mapping and lattice transformations. The second level is uncoded but undergoes mapping and lattice transformation. After an addition of the two levels, a second-stage lattice transformation is performed so as to obtain a zero-mean constellation. The symbols output from such three-level coset coder are then further modulated.

11 Claims, 23 Drawing Sheets

(51) Int. Cl.
  *H03M 13/25* (2006.01)
  *H04B 10/2581* (2013.01)
  *H04B 10/516* (2013.01)
  *H04L 1/00* (2006.01)
  *H04L 27/34* (2006.01)
  *H04L 27/38* (2006.01)
  *H03M 13/35* (2006.01)
  *H03M 13/15* (2006.01)

(52) U.S. Cl.
  CPC ....... *H04B 10/2581* (2013.01); *H04B 10/516* (2013.01); *H04J 14/00* (2013.01); *H04L 1/007* (2013.01); *H04L 1/0042* (2013.01); *H04L 1/0058* (2013.01); *H04L 27/3416* (2013.01); *H04L 27/38* (2013.01); *H03M 13/152* (2013.01); *H04L 1/0057* (2013.01)

(58) Field of Classification Search
  CPC ... H03M 13/251; H03M 13/152; H04L 27/38; H04L 1/007; H04L 27/3416; H04L 1/0042; H04L 1/0057; H04J 14/00
  USPC .......................................................... 398/43
  See application file for complete search history.

(56) References Cited

FOREIGN PATENT DOCUMENTS

| | | |
|---|---|---|
| JP | 2014-064174 | 4/2014 |
| KR | 10-2012-0104129 | 9/2012 |

OTHER PUBLICATIONS

Forney, "Sphere-Bound-Achieving Coset Codes and Multilevel Coset Codes", IEEE Transactions on Information Theory, IEEE Press, USA, vol. 46, No. 3, May 1, 2000.*
European Telecommunications Standard Institute (ETSI), Access, Terminals, Transmission and Multiplexing (ATTM); 1 Gbps and 100 Mbps data rate physical layer for Plastic Optical Fibre, ETS ITS 105 175-1-2 V0.0.4; Jun. 2014; pp. 1-70.
Langton, Charan; Intuitive Guide to Principles of Communication, Lattice and Trellis Coded Modulation (TCM); 2004; pp. 1-10.
Viland et al; Coset Partitioning for the 4-PSK Space-Time Trellis Codes; IEEE ISBN:978-1-4244-3785-6; 2009; pp. 1-4.
Search report dated Jul. 14, 2015 in corresponding EP Application No. EP 15382005.5.
Action dated Feb. 7, 2017 in corresponding Korean application 10-2016-0004938, with English translation, 25 pages.
Pedro Reviriego et al, Introducing Energy Efficeincy in the VDE 0885-763 Standard for High Speed Communication over Plastic Optical Fibers, IEEE Communications Magazine, Aug. 2013, pp. 97-102.
Yixuan Wang et al, 3 Gbit/s Transmission over Plastic Optical Fiber with Adaptive Tomlinson-Harashima Precoded Systems, 2013 IEEE International Conference on Consumer Electronics (ICCE) 2013, pp. 629-632.
Action dated Dec. 6, 2016 in corresponding Japanese application 2016-004173, with English translation, four pages.

* cited by examiner

Fig. 20

Weight distribution for all double-error-
correcting binary primitive BCH codes is
known, then their exact undetected error
probabilities can be calculated

| (n,k,t) BCH code | p | $P_{ue}$ by (1) | $P_{ue}$ by (1) + (3) | $P_{ue}$ by (2) + (3) | $P_{ue}$ by (4) |
|---|---|---|---|---|---|
| (31, 21, 2) | 1.26e-8 | 3.7e-21 | 4.6e-21 | 3.3e-21 | 4.4e-21 |
| (127, 113, 2) | 1.26e-8 | 3.2e-19 | 3.3e-19 | 3.1e-19 | 3.3e-19 |
| (511, 493, 2) | 1.26e-8 | 2.2e-17 | 2.2e-17 | 2.2e-17 | 2.2e-17 |
| (511, 250, 31) | 4.4e-3 | - | 1.6e-60 | 1.9e-61 | 1.6e-60 |
| (1023, 708, 34) | 4.4e-3 | - | 1.1e-58 | 3.3e-59 | 1.1e-58 |
| (1023, 443, 73) | 4.4e-3 | - | 1.2e-169 | 3.7e-172 | 1.2e-169 |

Peterson estimation
is good!!!!

Equation (4) gives a good estimation
of the undetected error probability

Fig. 22

| | BER ≤ $10^{-10}$ | BER ≤ $10^{-11}$ | BER ≤ $10^{-12}$ | BER ≤ $10^{-13}$ | BER ≤ $10^{-14}$ |
|---|---|---|---|---|---|
| Relative link budget (dBo) | 0,13 | 0,05 | -0,03 | -0,12 | -0,19 |
| MTBE | 5m:45s | 57m:28s | 9h:32m | 4 days | 39 days |
| MTTFPA -PHY + FCS- (years) | $6,9 \cdot 10^{18}$ | $3,2 \cdot 10^{19}$ | $1,4 \cdot 10^{20}$ | $6,0 \cdot 10^{20}$ | $2,4 \cdot 10^{21}$ |
| MTTFPA -only PHY- (years) | $1,6 \cdot 10^{9}$ | $7,4 \cdot 10^{9}$ | $3,3 \cdot 10^{10}$ | $1,4 \cdot 10^{10}$ | $5,7 \cdot 10^{11}$ |

TWO-LEVEL COSET CODING SCHEME FOR GIGABIT ETHERNET OVER PLASTIC OPTICAL FIBER

FIELD OF THE INVENTION

The present invention relates to a transmission of data over a plastic optical fiber. In particular, the present invention relates to a method and an apparatus for transmitting and receiving data over a plastic optical fiber using an adaptive error-correcting code and modulation scheme.

BACKGROUND OF THE INVENTION

Today's communications systems utilize various types of cable and radio interfaces. The most reliable are glass optical fibers which also enable very high transmission rates. On the other hands, copper cables still form part of the telephone lines which are also used for transmission of data. Especially in the last decades, wireless communications developed rapidly. All these data transport media have their own characteristics and are suitable for deployment in different scenarios and architectures.

Glass optical fibers (GOF) are used nowadays especially for communication requiring a very high bandwidth and very low attenuation. Since glass optical fibers have very small diameters and low numerical apertures (NA) its installation requires special and expensive connector tools and skilled installation workers.

Another possibility is the deployment of plastic optical fibers (POF), for instance, based on polymethacrylate (PMMA) with a larger core diameter (about 1 mm) and a high numerical aperture (NA of approximately 0.3 to 0.5). The least expensive and most used plastic optical fiber is an SI-POF with a numerical aperture of 0.5. However, there is also an SI-POF with a low numerical aperture of 0.3 enabling higher data rates as well as PMMA GI-POF with a bandwidth length product near to 1 GHz×100 meter. PMMA has several attenuation windows that enable POF to be used with different visible light sources from blue to red Light Emitting Diodes (LED) or red Lasers Diodes (LD).

In comparison with GOF, plastic optical fibers have an advantage of a very easy installation. They can be deployed by professional or non-professional installation workers using basic tools such as scissors or cutters and inexpensive plastic connectors. It is resilient to misalignment and strong vibrations so it can be installed in industrial and automotive environments without loss of communication capacity. The POF connections also have much higher tolerance to residual dust on the terminal faces than GOF, due to the larger core diameter.

Since the transmission over POF is optic, plastic optical fibers are completely immune to electrical noise. Thus, the existing copper wiring will not interfere with data passing through plastic optical fibers so it can even be installed next to electrical cabling. Plastic optical fiber connectors and optoelectronics for POF are mainly low cost consumer parts which enable installation workers to save cable costs and installation, testing, and maintenance time. Plastic optical fibers have been widely employed, in particular, for infotainment networks in cars and can now be seen as a global standard for high-speed on-board car networks such as Media Oriented Systems Transport (MOST).

FIG. 1 illustrates an example of a system for transmission and reception of data over POF. The transmission over plastic optical fibers is based on a light intensity modulation with direct detection. The signal to be transmitted is generated from a digital circuit 110 for encoding and modulating the user bit stream information and passed to a transmitter (Tx) analogue front end (AFE) 120 for conversion of digital data into an electrical signal for controlling the light emitting element 130. After this conversion of the electric signal to an optical signal, the latter is then input to the optical fiber 150. Electrical optical converters used for plastic optical fibers are typically light-emitting diodes (LED) characterized by properties such as a peak wavelength, a wavelength width or launching modal distribution.

During the transmission of the signal via plastic optical fibers 150, the light is affected by severe attenuation as well as distortion mainly due to modal dispersion. The modal dispersion is caused by different modes of light propagating in the fiber on different paths and with different speeds and attenuations, resulting in different arrival times at the receiver. The optical signal is also affected by a so-called mode coupling where the energy of higher order modes is transferred to lower order modes and vice versa. As a consequence, an optical pulse is broadened which leads to lower the signal bandwidth.

At a receiver, the optical signal from the plastic optical fiber 150 is converted into electrical intensity by means of an opto-electric converter 170 such as a photodiode. Then, the electrical signal is processed by the analog front end (AFE) 180. In particular, it is amplified, inter alia by a transimpedance amplifier (TIA) and connected to a digital receiver 190. The TIA is typically the most important noise source which limits the final sensitivity of the communication system.

Regarding the data transmission technology, GOF have been successfully using a non-return-to-zero (NRZ) modulation. In particular, current glass fiber communication systems mainly utilize NRZ 8b/10b or NRZI 4b/5b line coding which requires a baud rate of 1.25 GHz and 125 MHz for 1 Gbps and 100 Mbps solutions, respectively. Current plastic optical fiber solutions thus also adopted NRZ modulation for data communications. However, plastic optical fibers have a frequency and time response different from that of glass fibers and also have considerably higher attenuation. As a communication medium, plastic optical fibers show a very high modal dispersion due to its important differential mode delay and differential mode attenuation. The large area photodiodes required for coupling with a fiber typically have a limited bandwidth. In view of a plastic optical fiber frequency response, solutions supporting 100 or 150 Mbps are possible up to ca. 50 meters; however, 1 Gbps does not seem to be achievable without a more advanced technology such as the one disclosed in published European Patent application EP 2 498 432.

On the other hand, the advanced technologies are often designed with the aim of improving the coding and spectral efficiency for the particular channel. However, for practical deployment, also other design aims such as latency are of interest.

SUMMARY OF THE INVENTION

In view of the above mentioned limitations of plastic optical fiber, the aim of the present invention is to provide an efficient transmission system with possibly low latency over plastic optical fibers.

This is achieved by the features of the independent claims.

Further advantageous embodiments are put forward in the dependent claims.

Employing the plastic optical fiber provides many advantages. In particular, with respect to wireless and electric transmission media, POF are resilient against electro-magnetic interference. In comparison with glass optical fiber, POF enables easier installation, is less expensive and provide higher robustness with respect to connections. The present invention exploits the advantages of POF and provides an adaptive system which enables a high data-rate communication over POF.

It is the particular approach of the present invention to transmit data over POF coded by a two-level coset coding after interleaved splitting of the input data into the levels, with one level coded by BCH and a second level uncoded, followed by coset mapping, translation, rotation and scaling, addition of the levels and finally PAM modulation. One of the advantages of the approach is a low latency caused in particular by selecting the two-level coding with a BCH code and the interleaved splitting.

In accordance with an aspect of the invention, a method is provided for coding digital data for transmission over a plastic optical fiber (150), the method comprising the steps of: coding input digital data by a two-level coset coding including: separating from the input digital data a first portion and a second portion of data, each with a predetermined number of bits including cyclically assigning a first predetermined number of bits to the first portion and a second predetermined number of bits to the second portion; coding the first portion of data with a first shortened BCH code in a first level; in the first level, mapping the coded first portion onto symbols of a first predefined multilevel quadrature amplitude modulation constellation and performing a first-stage lattice transformation of the mapped symbols so as to achieve coset partitioning; in the second level, mapping the second portion onto symbols of a second predefined multilevel quadrature amplitude modulation constellation and performing the first-stage lattice transformation of the mapped symbols; adding the transformed symbols from the first and the second level; performing a second-stage lattice transformation for achieving a zero-mean constellation, and modulating the symbols encoded with the two-level coset coding using a multilevel pulse amplitude modulation including time multiplexing the in-phase and quadrature output of the second-stage lattice transformation in time domain.

Preferably, the first predefined multilevel quadrature amplitude modulation constellation is 16-QAM with Gray mapping whereas the second predefined multilevel quadrature amplitude modulation constellation is 8-QAM with $RZ^2$ lattice mapping.

For instance, the first-stage lattice transformations include translation, scaling and/or rotation of a symbol, and/or the second-stage lattice transformation includes rotation of the constellation; and/or modulo operation for constraining the constellation symbols to a square region in a first 2D quadrant; and/or centering and scaling.

Advantageously, for a block of input data bits, the first portion of data has the length of 1668 bits and the second portion has the length of 1482 bits, wherein the first predetermined number of bits is 4 and the second predetermined number of bits is 3, and the BCH coder generates codewords with 1976 bits based on 1668 input information bits. The time domain modulation is then 16-PAM.

The method as described above may further comprise a step of Tomlinson-Harashima precoding (THP) applied to the modulated symbols. However, it is noted that the present invention may also work with other kind of equalizers in addition or alternatively to the THP.

In accordance with another aspect of the present invention a method is provided for decoding a digital signal encoded with a two-level coset coder and received via a plastic optical fiber, the method comprising the steps of: demodulating the encoded digital signal with a time-domain multilevel pulse amplitude modulation to obtain symbol codewords and transforming them with a second-stage inverse lattice transformation, decoding the demodulated and transformed symbols with a two-stage decoder including the steps of: extracting a first portion of a codeword by applying a first-stage inverse lattice transformation, a symbol detector for a first predefined multilevel quadrature amplitude modulation constellation, and a modulo operation to a demodulated symbol; decoding (3440) in a first stage the first portion with a symbol demapper and a shortened BCH decoder and based on the decoded first portion selecting a first coset; feeding back the decoded first portion by mapping the decoded first portion onto symbols of the first predefined multilevel quadrature amplitude modulation constellation and performing the first-stage lattice transformation of the mapped symbols; obtaining (3460) a second portion by subtracting the decoded and fed-back first portion from the demodulated symbol and by applying the first-stage inverse lattice transformation, a symbol detector, a modulo operation, and a symbol demapper; and multiplexing (3470) the decoded first and second portion bits including cyclically outputting a first predetermined number of bits from the first portion and a second predetermined number of bits from the second portion.

A computer readable medium is also provided, storing thereon instructions which when executed by a processor, cause the processor to execute any of the methods described above.

In accordance with yet another aspect of the present invention, an apparatus for coding digital data for transmission over a plastic optical fiber (150), the apparatus comprising: a two-level coset coder for coding input digital data by a two-level coset coding including: a demultiplexer for separating from the input digital data a first portion and a second portion of data, each with a predetermined number of bits including cyclically assigning a first predetermined number of bits to the first portion and a second predetermined number of bits to the second portion; a BCH code for coding the first portion of data with a first shortened BCH code in a first level; a first mapper for, in the first level, mapping the coded first portion onto symbols of a first predefined multilevel quadrature amplitude modulation constellation and performing a first-stage lattice transformation of the mapped symbols so as to achieve coset partitioning; a second mapper for, in the second level, mapping the second portion onto symbols of a second predefined multilevel quadrature amplitude modulation constellation and performing the first-stage lattice transformation of the mapped symbols; an adder for adding the transformed symbols from the first and the second level; a transformation unit for performing a second-stage lattice transformation for achieving a zero-mean constellation, and a modulator for modulating the symbols encoded with the two-level coset coding using a multilevel pulse amplitude modulation including time multiplexing the in-phase and quadrature output of the second-stage lattice transformation in time domain.

In accordance with yet another aspect of the present invention, an apparatus for decoding a digital signal encoded with a two-level coset coder and received via a plastic optical fiber, the apparatus comprising: a demodulator for demodulating the encoded digital signal with a time-domain multilevel pulse amplitude modulation to obtain symbol codewords; a first transform unit for transforming the demodulated symbols with a second-stage inverse lattice transformation, a multi-level decoder for decoding the demodulated and transformed symbols with a two-stage decoder including: a first extractor for extracting a first portion of a codeword by applying a first-stage inverse lattice transformation, a symbol detector for a first predefined multilevel quadrature amplitude modulation constellation, and a modulo operation to a demodulated symbol; a BCH decoder for decoding (3440) in a first stage the first portion with a shortened BCH decoder and based on the decoded first portion selecting a first coset; a first mapper for mapping the decoded first portion onto symbols of the first predefined multilevel quadrature amplitude modulation constellation and performing the first-stage lattice transformation of the mapped symbols; a second extractor for obtaining (3460) a second portion by subtracting the decoded and mapped first portion from the demodulated symbol and applying the first-stage inverse lattice transformation and a modulo operation; a multiplexer for multiplexing (3470) the decoded first and second portion bits including cyclically outputting a first predetermined number of bits from the first portion and a second predetermined number of bits from the second portion.

An integrated circuit is also provided, embodying the apparatus according as described above.

BRIEF DESCRIPTION OF THE DRAWINGS

The above and other objects and features of the present invention will become more apparent from the following description and preferred embodiment given in conjunction with the accompanying drawings in which:

FIG. 20 is a table illustrating the calculation of probability of undetected errors for several different BCH codes and various formulas for calculation;

FIG. 22 is a table illustrating the performance of the MLCC in terms of MTBE, MTTFPA and BER.

DETAILED DESCRIPTION OF THE INVENTION

The problem underlying the present invention is based on an observation that techniques typically used for optical glass fiber are not sufficient to achieve an efficient transmission of data over a plastic optical fiber. Due to a difference between characteristics of plastic optical fiber channels compared to glass optical fibers, wireless or copper channels, the techniques developed and employed for such channels are also not directly applicable to plastic optical fibers. It is one of the aims of the present invention to enable a highly spectrally-efficient data communications over POF. Moreover, the more advanced approaches are often connected with higher latency.

One of the general criteria for designing a communications system is maximizing the capacity of the channel. Channel capacity bound can be calculated in accordance with the information theory using the Shannon limit on rate defined as maximum mutual information of a random variable at the input and the output of the channel. However, in practice it is difficult to achieve such theoretical bounds. This is caused inter alia by the real elements employed, which in general do not have ideal characteristics. Another important factor when designing a communications system is its efficiency in terms of implementation complexity, which has direct impact on the costs and feasibility of the product as well as on its latency.

Figure 2:
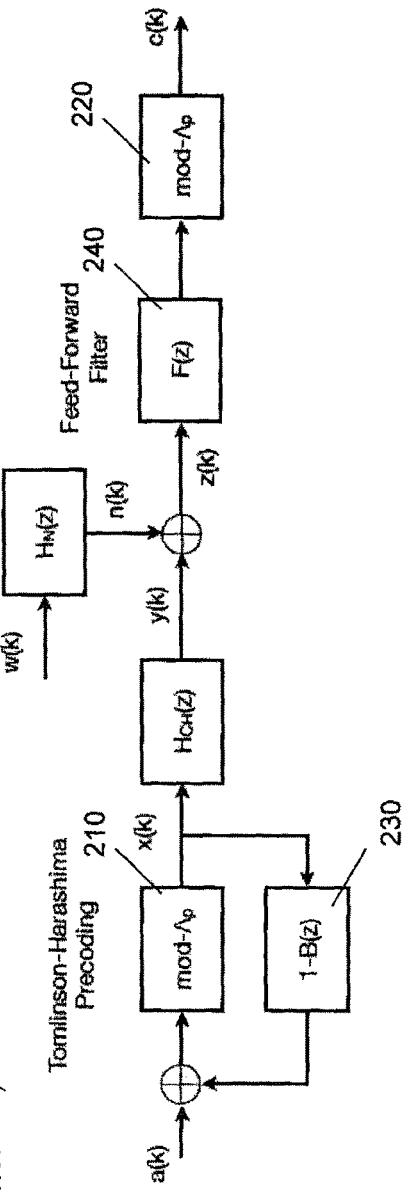
FIG. 2 are block diagrams illustrating the functionality of Tomlinson-Harashima Precoding.

FIG. 2 illustrates a well-known employment of THP with an M-PAM modulation. The Tomlinson-Harashima precoder moves the feedback filter 230 of a DFE (Decision Feedback Equalization) structure to the transmitter and combines it with a modulo operator 210 in order to reduce the post-cursor ISI compensated symbols to the precoding Voronoi region of the corresponding M-PAM constellation. The feed-forward filter 240 remains at the receiver to compensate the cursor and pre-cursor ISI and to whiten the noise. Then, a modulo operator 220 analogous to the transmitter-side modulo operator 210 is needed to recover the transmitted symbols. The THP is capable of approaching the performance of the ideal DFE without error propagation, for middle and high spectrally efficient modulations.

An equivalent linear discrete-time channel model can be built by sampling the continuous-time optical channel. THP at input of the channel and feed-forward equalization at the receiver are added to compensate the ISI and to whiten the noise.

Under the assumptions (channel model) that ISI can be fully compensated by the THP plus FFE and FFE fully whitens the channel noise, the equivalent channel is a memoryless channel with additive white Gaussian noise (AWGN).

The modulo operation at the receiver may be advantageously embedded into the M-PAM decoder to avoid symbol flipping.

THP employed at the transmitter requires a feedback from the receiver in order to obtain current channel response. Despite this small implementation drawback, THP still remains suitable for the prevailing part of the aimed POF applications. For instance, THP is suitable for any of a star topology, daisy chain topology or tree topology. In the star topology, each node is connected to the network through a packet switch by means of a duplex POF having two fibers for the respective two directions. In daisy chain topology, some nodes have packet switching capability and more than one duplex interface. A node is connected to the network and, at the same time, works as a bridge between the different network domains with which it is interconnected. Tree topology is an evolution of the daisy chain topology, in which some nodes have more than two duplex POF interfaces. These three topologies are in general suitable for any kind of video-based sensor applications or media distribution, especially for the home network applications, industrial plants or automotive applications, in particular, interconnecting cameras and screens.

Figure 1:
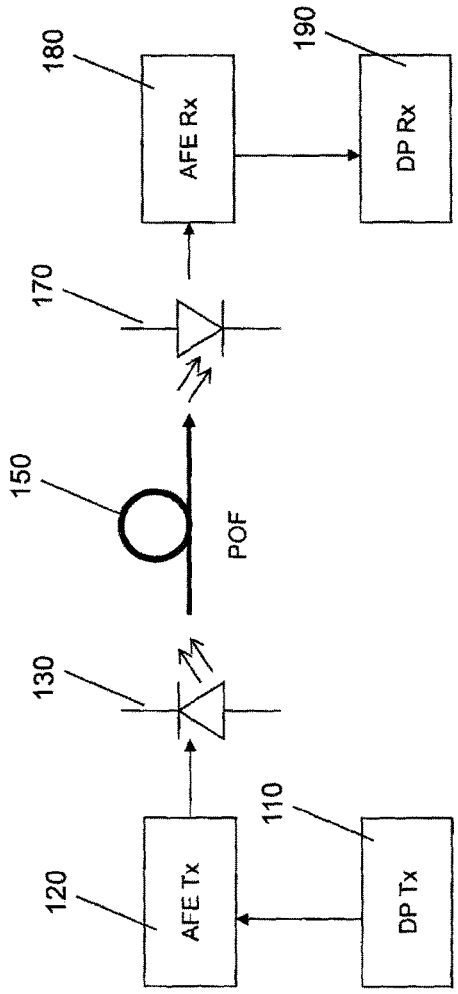
FIG. 1 is a schematic drawing illustrating an example of a system for transmission and reception of data over POF.
Figure 5A:
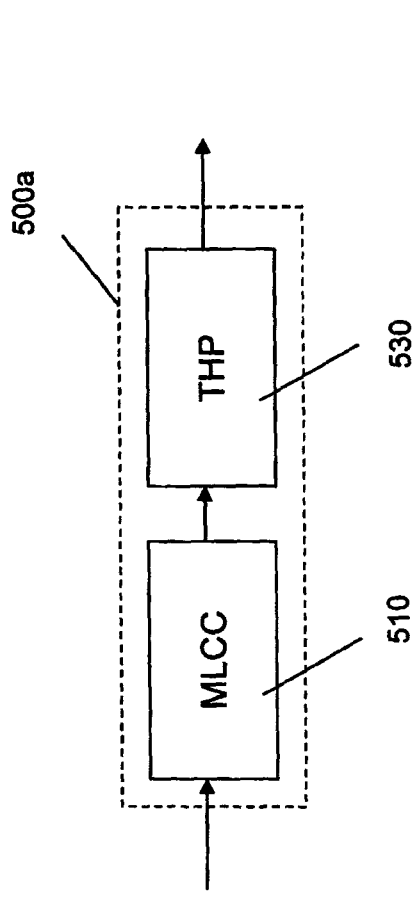
FIG. 5A is a block diagram illustrating an encoder in accordance with the present invention.
Figure 5B:
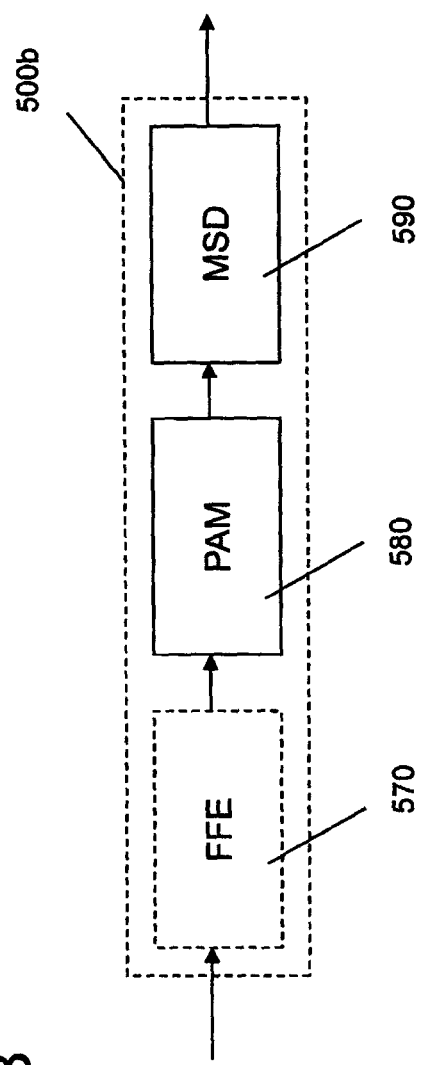
FIG. 5B is a block diagram illustrating a decoder in accordance with the present invention.

FIG. 5A and FIG. 5B illustrate the respective encoder 500a and decoder 500b, which may form a part of the transmitter digital circuit 110 and the receiver digital circuit 190 as shown in FIG. 1. In particular, the encoder 500a is input a digital bit sequence, which is then encoded by a multi-level coset coding (MLCC) 510. The coded MLCC symbols are then modulated by a time-domain modulation such as an M-ary pulse amplitude modulation (M-PAM), which is considered here to be a part of the MLCC coder 510, and the PAM symbols are further precoded by a pre-coder 530. The decoder 500b includes a time-domain demodulator 580 for demodulating the receiver signal and an multiple-stage decoder 590 for decoding the demodulated symbols. If THP was not applied, FFE 570 may be employed as an equalizer. If THP is applied, FFE may equalize the cursor and the post-cursor of the channel impulse response, as well as whiten the noise. In such a case, 570 is the feed-forward filter 240 of THP structure.

Figure 3A:
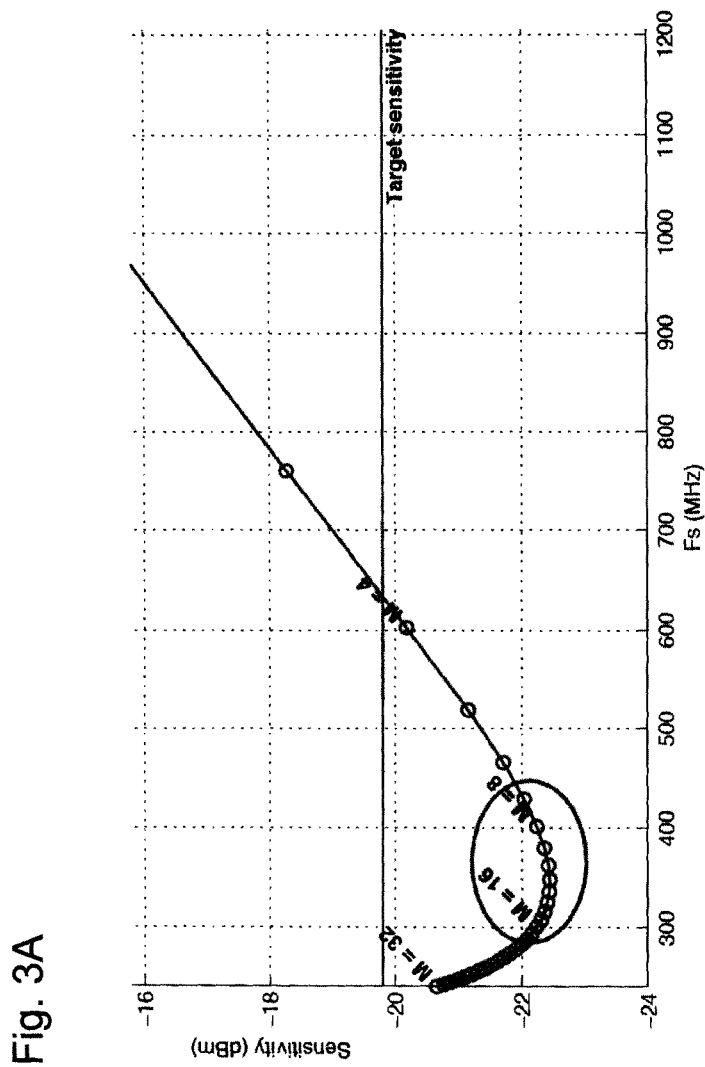
FIG. 3A, 3B, 3C are graphs showing some results of investigation supporting selection of a particular coding scheme.

When designing a coding for a channel, spectral efficiency and the baud-rate is to be selected. The Shannon capacity analysis suggests that the optimal scheme should be an M-PAM with M being between 8 and 16, for THP and code-rate of 0.8. The corresponding sensitivity in dBm for different values of M depending on the symbol frequency Fs is shown in FIG. 3A. The baud-rate has to be between 300 and 400 MHz. According to the investigations of the inventors, the baud-rates closer to 300 MHz tend to provide smaller DSP power consumption for channel equalization as well as simpler and lower consumption designs of DAC and ADC.

Selection of the optimal spectral efficiency and baud-rate is a complex task that requires to take into consideration several factors to obtain a solution, such as tradeoff between the latency and the coding gain, implementation complexity of the FEC and DSP, memory requirements, statistical analysis of how the errors are produced at the output of the FEC, error detection capabilities of the FEC in addition to the correction ones, discrete design space of implementable codes, a holistic approach to consider important elements such as scramblers, transmission structure, how the timing is recovered, the channel equalized, etc. Moreover, the clock references and clock speeds of data interface with MAC (e.g. GMII) has to be taken into account.

Figure 3B:
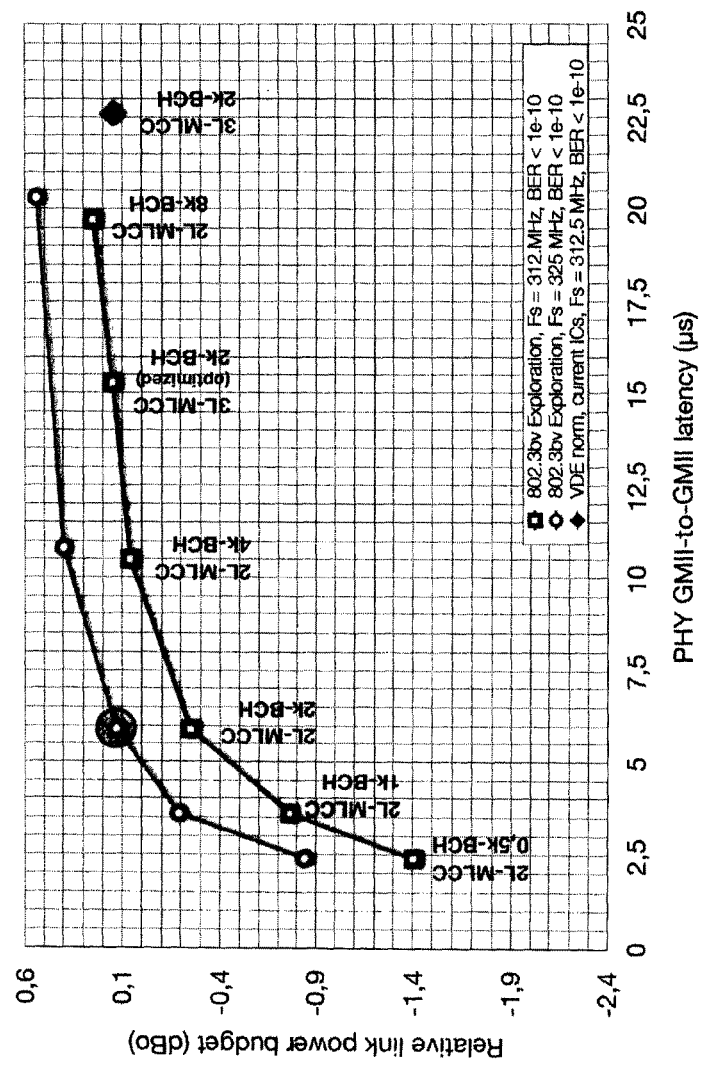
Figure 3C:
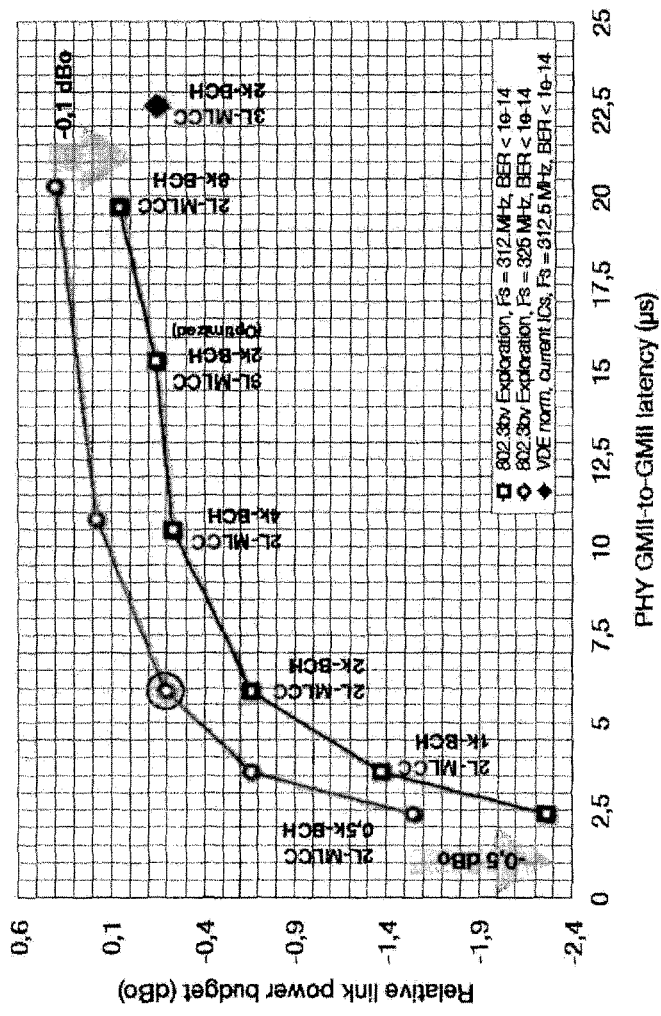

FIG. 3B shows relative link power budget in dBo for latency between the physical layer GMII-to-GMII in microseconds for the bit error rates BER<1e-10, FIG. 3C for BER<1e-14. For a lower BER, the power budget decreases faster for lower latencies. In particular, link budget for low latency FECs is highly affected by the BER specification, since "shorter" codes (i.e. codes with shorter codewords and thus also shorter latency) provide smaller error correction capabilities, having BER more dependent on the SNR of the decoder. For "longer" codes (high latency), the link budge variation as a function of BER is approximately constant. These codes show a harsh BER vs. SNR performance curve.

The code marked by a double circle represents an advantageous position in the curve since the latency is relatively low (approximately 6 microseconds) and the link budget performance is same as for the current ICs implemented according to the VDE norm. Moreover, such a code provides also for low implementation complexity and low power consumption and is very robust against unconsidered impairments and/or implementation losses. Furthermore, the MTTFPA (mean time to false packet acceptance) is high.

Having investigated these features of the codes, the corresponding code has been selected, namely a two-level coset code with the codeword length around 2000 bits. In the following, exemplary embodiment of one such possible code is presented in detail.

A multi-level coset coding is a sphere-bound capacity achieving coding technique. The theoretical description and design of MLCC can be found in G. D. Forney et al., "*Sphere-bound-achieving coset codes and multilevel coset codes*", IEEE Trans. on Information Theory, vol. 46, no. 3, May 2000, pp. 820-850, which is incorporated herein by reference. In particular, in Sections V.E, V.F and VII.B. Multilevel Coset Coding (MLCC) with two levels based on $Z^2$ and $RZ^2$ lattices in accordance with an embodiment of the invention is capable of adjusting accurately the spectral efficiency with low complexity binary component codes. The constellation is partitioned in such a way the bits more likely to be corrupted by noise are protected by a binary code, and those bits less corrupted are no protected.

The theoretical rules are formulated in terms of the code-rate of the component codes, partition channel capacities and modulo-aliased noise present at each decoding level assuming Multi-Stage Decoder (MSD) decoding. However, the mathematical theory does not deal with the particular characteristics of the binary component codes which are also suitable for implementation in a "real-world", meaning, for instance hardware or software implementation. In the above mentioned literature, Low Density Parity Check Codes (LDPC) have been studies as possible component codes for MLCC. However, LDPC codes require a rather high computational complexity for decoding which, on the other hand, requires more area in the hardware implementation and causes higher power consumption. In terms of optical link power budget, the improvement caused by employing LDPC beside BCH appears to be negligible. Moreover, with LCPC code there is a potential error floor a compensation of which could require employment of an additional algebraic outer code.

Bose, Chaudhuri, Hocquenghem (BCH) binary codes are almost perfect algebraic codes in terms of minimum Hamming distance between the codewords. BCH codes do not have an error floor when hard-decision coding is applied. BCH codes also provide advantage of a simple implementation which can easily be embedded, for instance, in an integrated circuit. For high code rates, BCH codes provide high coding gain, which, on the other hand, decreases for middle and lower code rates.

Figure 4:
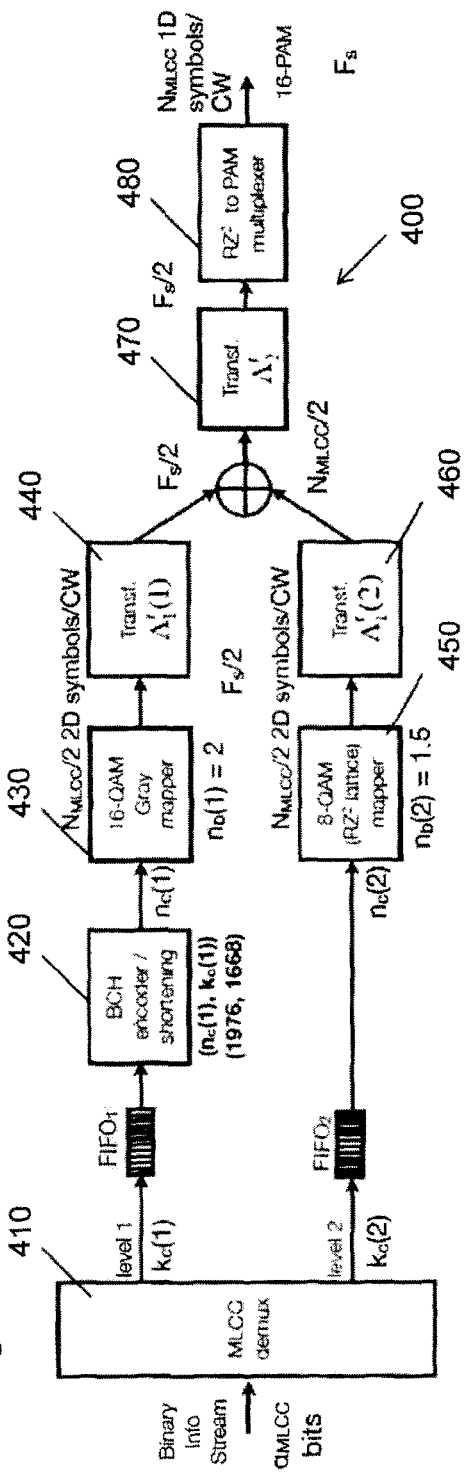
FIG. 4 is a block diagram showing a transmitter with a two-level coset coding and modulation in accordance with an embodiment of the present invention.

FIG. 4 illustrates an MLCC encoder 400 which may be employed in place of the MLCC encoder 510 shown in FIG. 5A in accordance with the present invention. The binary input stream is segmented into blocks of $\alpha_{MLCC}$ bits. The encoder 400 is input a bit sequence of information of length $\alpha_{MLCC}$ belonging to one MLCC codeword to be transmitted. The number of bits $\alpha_{MLCC}$ may be selected in accordance with the desired spectral efficiency with regard to the channel quality. The information bits to be coded as an MLCC codeword are first split in an MLCC demultiplexer 410 into two MLCC levels. In particular, a portion of information with $\alpha_{MLCC}$ bits is split into portions having respectively $k_c(1)$ and $k_c(2)$ bits, each of which is input to a corresponding MLCC level, wherein $\alpha_{MLCC}=k_c(1)+k_c(2)$.

The splitting is advantageously done in an interleaved manner, in particular by separating from the input digital data a first portion and a second portion of data, each with a predetermined number of bits including cyclically assigning a first predetermined number of bits $n_{b,demux}(1)$ to the first portion and a second predetermined number of bits $n_{b,demux}(2)$ to the second portion.

Figure 6:
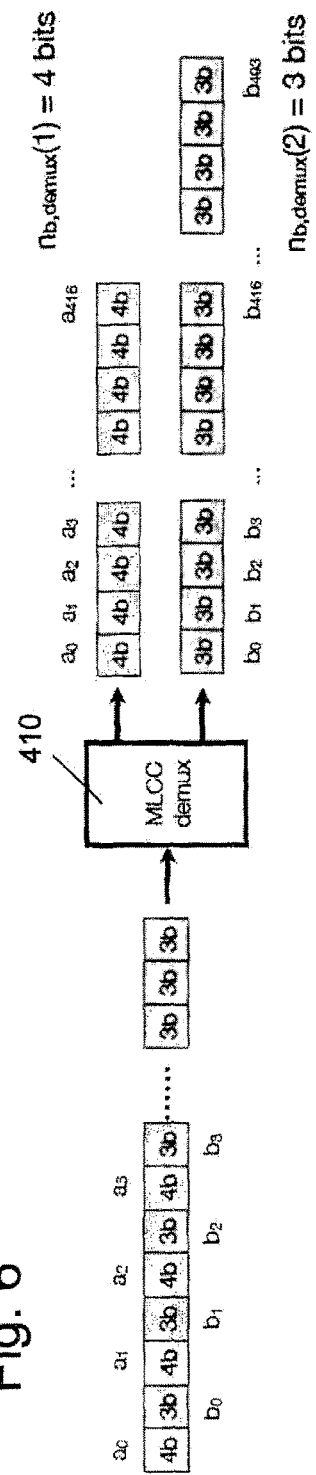
FIG. 6 is a schematic drawing of a demultiplexer for splitting the input data into the two levels of the two-level encoder.

The splitting is illustrated in FIG. 6. In particular, the bit ordering is established to achieve the minimum latency of the encoder as well as the multistage decoder (MSD). To practicalities sign the splitting, for the i-th level (i=1 or 2, for 2-level coding), we define $n_{b,demux}(i)=2 \cdot n_b(i)$ bits. Here, $n_b(i)$ is the number of coded bits per dimension for the i-th level. This parameter specifies the constellation. The input information is split between the two levels by allocating $n_{b,demux}(1)$ bits to the first level and $n_{b,demux}(2)$ bits to the second level cyclically until $k_c(1)$ bits have been assigned to the first level. Once the first level is full, the remaining input bits are assigned to the second level until second level is full being achieved $k_c(2)$ bits (because in this exemplary case there are more bits in the second level than in the first level, otherwise the second level would become full as first and the remaining bits would be assigned to the first level). The term "full" refers to the fact that the number of bits $k_c(i)$ of the input codeword designated for the particular level i is achieved. In FIG. 6, bit quadruples $a_i$ with i=0 . . . 416 and bit triples $b_i$ with i=0 . . . 493 are respective portions assigned to the first and to the second level. The term "4b" represents four bits whereas the term "3b" represents three bits. Numbers 416 and 493 result from the selected length $k_c(1)$ and $k_c(2)$. Namely, $k_c(1)=1668$ bits divided by $n_{b,demux}(1)=4$ result in 417. Similarly, $k_c(2)=1482$ bits divided by $n_{b,demux}(2)=3$ result in 494.

Figure 18A:
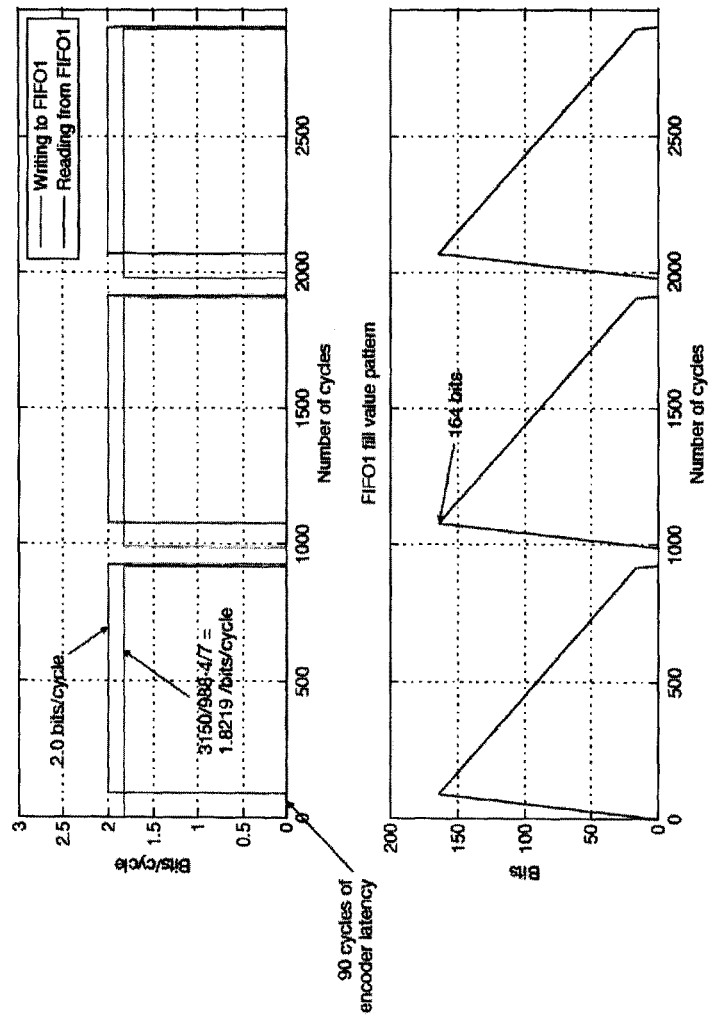
FIG. 18A, 18B are graphs illustrating operation of FIFO1 and FIFO2 of the encoder.
Figure 18B:
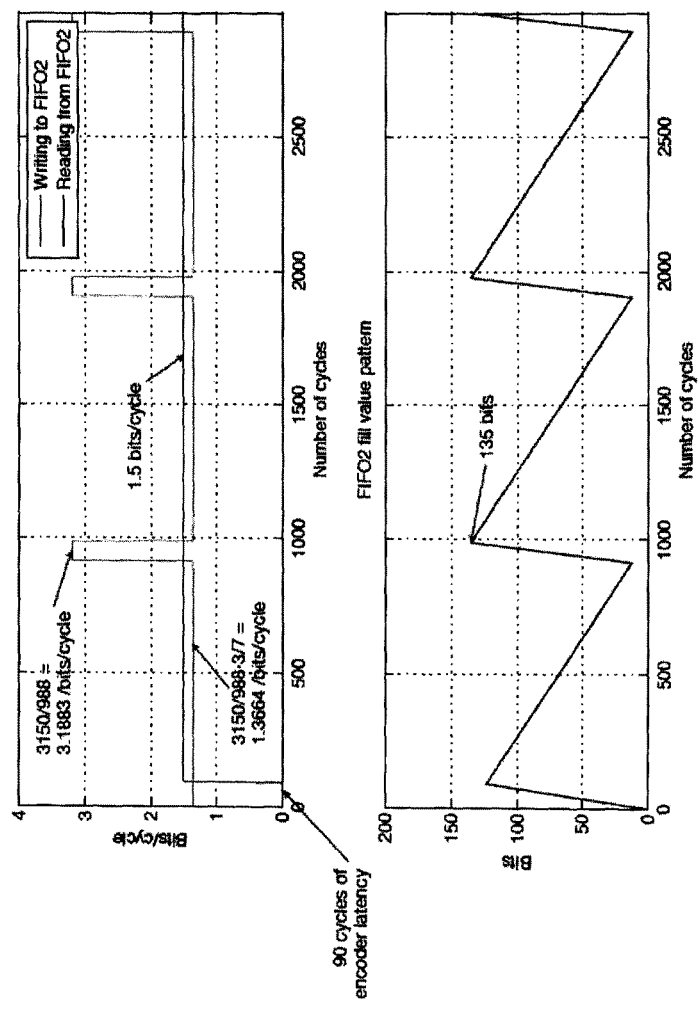

FIFO1 and FIFO2 in FIG. 4 represent buffers of the type first-in, first-out located in the respective two levels. FIFO1 and FIFO2 are present to provide a constant data flow in both the input and the output of the encoder and are also needed for rate matching. The required size of these FIFOs determines the latency of the MLCC encoder, because the rest of blocks can be considered with no latency. The MLCC multiplexing pattern as described above, has been chosen to minimize the memory requirements of the FIFOs as well as the latency of both, the encoder and the decoder. For the present example with 3150 bits per codeword input to the MLCC and 988 PAM symbols output from the encoder and assuming the frequency of 325 MHz, the input rate optimally corresponds to 3150/988=3.1883 bits/cycle. FIGS. 18A and 18B illustrate the encoder latency for FIFO1 and FIFO2 respectively. As can be seen from the Figures, the encoder latency is low, only 90 cycles, which corresponds to 0.27 microseconds for Fs=325 MHz. The memory requirements are 164 bits for FIFO1 and 135 bits for FIFO2.

The first level of the two-level MLCC encoder includes forward error correction coding 420. The second level is uncoded. The forward error correction coder 420 encodes the $k_c(1)$ bits into $n_c(1)$ coded bits. In the uncoded second level, analogously $n_c(2)=k_c(2)$. In particular, as the MLCC forward error correction component code, a BCH code was selected. The selection of a particular binary BCH code for the first level is critical to guarantee performance and to avoid error-floor of the MLCC scheme.

A binary BCH code is particularly suitable for this application due to its low complexity and correcting capabilities.

The parity introduced by the BCH code for error correction capability in the receiver can also be used to assert decoding failure when the decoder is not able to correct the received code-word, for detecting errors. Decoding failure assertion can be used for instance by the PHY (physical layer) of the Ethernet protocol stack to indicate to MAC an Ethernet frame is corrupted by using GMII RX_ER signal and avoid bad packet delimiter detection that can produce either error propagation over Ethernet packets that were received correctly, generation of extra packets that were not transmitted or packets overlapping. Here, GMII refers to Gigabit Medium Independent Interface, which is located on upper part of the physical layer followed by MAC (Medium Access Control). The lower part of the physical layer includes, on the other hand, a medium dependent interface (MDI).

As will be shown, FCS (frame check sequence) does not suffice to provide large enough Mean Time To False Packet Acceptance (MTTFPA). Therefore, detection capability of BCH code as part of the FEC will be necessary. In the following, a method is shown for a correct computation of the Undetected Error Probability of BCH codes.

The undetected error probability for bounded-distance decoding of binary BCH codes (e.g. Berlekamp algorithm) is to be estimated, when they are used for both error correction and detection on a binary symmetric channel (BSC) with crossover probability p. For this analysis, it is assumed that the equalizer provides an AWGN channel to decoder input and symbol hard detection is implemented, having a BSC at the demapper output. It is also assumed that a bounded-distance decoder is used in conjunction with a t-error correcting (n,k) BCH code C with minimum distance $d_{min}$ where $t=\lfloor(d_{min}-1)/2\rfloor$.

If a received word is within Hamming distance $t=\lfloor(d_{min}-1)/2\rfloor$ of a codeword, the decoder selects that codeword as the one most likely to have been sent. If the selected codeword is not the one that was sent, we say that a decoder error has occurred. If there is no codeword within Hamming distance $t=\lfloor(d_{min}-1)/2\rfloor$ of a received word, then a decoder failure is declared.

If the weight distribution $\{A_j\}$ for C is known, exact expressions can be obtained for the probabilities of decoder error and failure. The probability of decoder error corresponds to the undetected error probability. The probability of undetected error for a bounded-distance decoder is (cf. M.-G. Kim and J. H. Lee. "*Undetected error probabilities of binary primitive BCH codes for both error correction and*

*detection". IEEE Transactions on Communications*, vol. 44, no. 5, pp. 575-580, May 1996, referred to in the following as [1]):

$$P_{uc}(p) = \sum_{w=t+1}^{n} \phi(w) P_E(w) \tag{1}$$

where $\phi(w)$ is the probability that a received word has weight w:

$$\phi(w) = p^w (1-p)^{n-w} \binom{n}{w}$$

and $P_E(w)$ is the decoder error probability which is defined as the ratio of number of words with weight w that lie within distance t from a codeword to the number of words with weight w in the whole vector space:

$$P_E(w) = \frac{\sum_{s=0}^{t} \sum_{j=w-s}^{w+s} A_j \binom{n-j}{\frac{s+w-j}{2}} \binom{j}{\frac{s-w+j}{2}}}{\binom{n}{w}}$$

Another expression for the probability of undetected error for a bounded distance decoder that appears in the literature is (cf. S. B. Wicker. *"Error Control Systems for Digital Communication and Storage"*. Englewood Cliffs, N.J.: Prentice Hall, 1995, referred to in the following as [2]):

$$P_{we}(p) = \sum_{j=d_{min}}^{n} A_j \sum_{k=0}^{\lfloor (d_{min}-1)/2 \rfloor} P_k^j \tag{2}$$

where is the probability $P_k^j$ that a received word is exactly Hamming distance k from a weight-j binary codeword is given by:

$$P_k^j = \sum_{r=0}^{k} \binom{j}{k-r} \binom{n-j}{r} p^{j-k+2r} (1-p)^{n-j+k-2r}$$

The weight distributions for most BCH codes are not known. It is necessary to examine either its $2^k$ codewords or the $2^{n-k}$ codewords of its dual code. The computation becomes practically impossible as n, k, and n-k become large. There are, however, a few useful results to be considered The weight distributions for all double- and triple-error-correcting binary primitive BCH codes have been found.

There is a number of different theorems that helps in estimating the weight distribution of a BCH code. One of the most important is the Peterson weight estimation, which is not an upper or a lower bound but an approximation (cf. R. Micheloni, A. Marelli and K. Eshghi. *"Inside Solid State Drives (SSDs)"*., Springer Series in Advanced Microelectronics 37, referred to in the following as [3]). Peterson Estimation: The weight Aj of a primitive BCH code of length n and error correction capability t can be approximated as $$A_j \cong \frac{\binom{n}{j}}{(n+1)^t} \tag{3}$$

By using the estimated weights it is now possible to obtain an estimation of the undetected error probability of binary primitive BCH codes. However, for m>10 (n=$2^m$-1 for binary primitive BCH codes), infinity values result from Peterson Estimation in MATLAB and it is not possible to calculate Pue.

In [1], it is shown that the undetected error probability of binary linear codes can be quite simplified and quantified if weight distribution of the code is binomial like. Large subclasses of binary primitive BCH codes have approximate binomial-like weight distribution. For those BCH codes the following expression for the undetected error probability is derived as follows:

$$P_{ue}(p) = 2^{-mt} \sum_{s=0}^{t} \binom{n}{s} \cdot \sum_{h=t+1}^{n} \binom{n}{h} p^h (1-p)^{n-h} \tag{4}$$

By using the formula above it is possible to calculate $P_{ue}$ for binary primitive BCH codes with m>10. Let us prove the validity of the later equation by applying it to calculate the undetected error probability of a number of binary primitive BCH codes and then comparing the estimated value for $P_{ue}$ with the result obtained by using alternative methods.

FIG. 20 shows a table in which the above probability calculations for several BCH codes are compared. An accurate approximation of the undetected error probability for bounded distance decoding of binary primitive BCH codes that have binomial-like weight distribution when they are used for both error correction and detection on a binary symmetric channel has been presented (equation (4)). Equation 4 is numerically stable for large BCH codes, therefore provides to us a method to calculate the Pue of BCH for MTTFPA analysis.

The MLCC according to an embodiment of the invention is based on a shortened BCH code. An ($n_c,k_c$) shortened BCH code is obtained by prepending $l_c$ zeros to the kc information bits, then using the corresponding primitive code to encode the resulting k-bit information block and finally removing the $l_c$ leading zeros from the obtained n-bit codeword. It consists of a subset of codewords of the primitive BCH code from which it was generated and that's why the error correction and detection properties of the primitive BCH code are guaranteed for the corresponding shortened code.

Advantageously, the BCH code is a code (nc(1), kc(1))= (1976, 1668) bits, which means that $k_c(1)$ bits enter the BCH encoder 420 and after encoding and shortening, $n_c(1)$ bits are output. This results in the coderate $r_c(1)=k_c(1)/n_c(1)=1668/1976\approx0.8441$. The BCH code (1976, 1668) is a shortened version of primitive BCH (2047, 1739). It is a BCH code over Galois field GF($2^m$), wherein m=11 and the error correction of such code is t=28, meaning that the code can correct up to t errored bits per codeword. The number of parity bits is $p_c(1)=n_c(1)-k_c(1)$, which is for the configuration (1976, 1668) $p_c(1)$=308 bits. Shortening is implemented by prepending some zero bits (bits with value zero) to the data bits. In particular, in this case 71 zero bits are prepended to the 1668 data bits. Spectral efficiency per dimension is then defined as:

$$\eta = \sum_{i=1}^{2} n_b(i) r_c(i)$$

In order to minimize the Galois field arithmetic necessary, we choose as primitive polynomial the irreducible polynomial of minimum weight over $GF(2^{11})$: $1+x^2+x^{11}$. The Generator Polynomial is given by $$G(x) = \sum_{i=0}^{p_c} g(i) \cdot x^i$$

where g(i) takes values 0 or 1. The order of G(x) for this BCH code is 308. The G(x) coefficients are given by:
h0014_B624_90DF_0781_4D88_99E9_B9DB6267_00D3_7A90_49DB_C0C4_484A_D6C5_49AB_AE7E_6F58_A406_CF86_C0BD.

However, it is noted that this code is merely an example of a particularly advantageous code for 325 MHz.

Other combinations are possible such as (2016, 1829). For such code and 1 Gbps operation mode at Fs=312.5 MHz the following further parameters are to be taken: The number of bits per codeword input to the MLCC $\alpha_{MLCC}$=3341 bits, number of output symbols $N_{MLCC}$=1008 symbols, number of bits in the first and the second level for one codeword $k_c(1)$=1829 bits and $k_c(2)$=1512 bits, length of the BCH codeword $n_c(1)$=2016 bits, number of bits per dimension per level in the two levels $n_b(1)$=2, $n_b(2)$=1.5 bit/dim.

The remaining coding operates similarly as for the above described MLCC. In particular, the splitting is performed with $n_{b,demux}(i)$=$2n_b(i)$ for level i, resulting in $n_{b,demux}(1)$=4 and $n_{b,demux}(2)$=3, cyclically in the first and second level until kc(1) bits were assigned to the first level. Then the remaining input bits are assigned to the second level. If $k_c(1)$ is not a multiple of $n_{b,demux}(1)$ as is here the case, then only rem($k_c(1)$, $n_{b,demux}(1)$) bits are allocated to the first level in the last assignation of bits for that level in a practical implementation. However, this is only example and the rem may also be assigned in the first or another assignation.

The constant bitrate of 3341/1008=3.3145 bits/cycle is assumed at the input of this MLCC encoder in order to have a constant symbol rate of 1 symbol/cycle at its output. Then, taking into accounts the MLCC demultiplexer interleaved operation mode, during first x1 clock cycles, of a period of 1008, the writing bit rates to the FIFOs in the first and the second level are given by:

$$R_{w.1.1\_x1} = \frac{n_{b,demux}(1)}{\sum_{i=1}^{2} n_{b,demux}(i)} \cdot \frac{\alpha_{MLCC}}{N_{MLCC}} = \frac{4}{7} \cdot \frac{3341}{1008} = 1.8940 \text{ bits/cycle}$$

$$R_{w.1.2\_x1} = \frac{n_{b,demux}(2)}{\sum_{i=1}^{2} n_{b,demux}(i)} \cdot \frac{\alpha_{MLCC}}{N_{MLCC}} = \frac{3}{7} \cdot \frac{3341}{1008} = 1.4205 \text{ bits/cycle}$$

$$\text{where } x_1 = \frac{\beta(1)}{R_{w.L1\_w1}} = \frac{1829}{1.8940} = 966 \text{ cycles.}$$

After x1 clock cycles the first level is full, and until clock cycle x2=1008, the writing bit rates to the FIFOs are given by:

$$R_{w.1.1\_x2} = 0 \text{ bits/cycle}$$

$$R_{w.1.2\_x2} = \frac{\alpha_{MLCC}}{N_{MLCC}} = \frac{3341}{1008} = 3.3145 \text{ bits/cycle}$$

The process is repeated. The worst case latency may be estimated similarly as for the above MLCC code resulting in 51 clock cycles in the first level and 54 clock cycles in the second level, the minimum FIFO depths are 102 and 81 bits respectively. For the decoder, the estimated worst case latency is 1388 clock cycles and the sizes of FIFOs are FIFO1,2=1136 symbols, FIFO1=97 bits and FIFO2=77 bits.

In general, the selection of (BCH) codes is made based on the target bit rate to be achieved and the selected baud rate, therefore, depending on both the spectral efficiency of the MLCC code. The length of the code basically depends on the channel characteristics and coding-gain vs. computational complexity tradeoff as is also described above with reference to FIG. 3.

Figure 7:
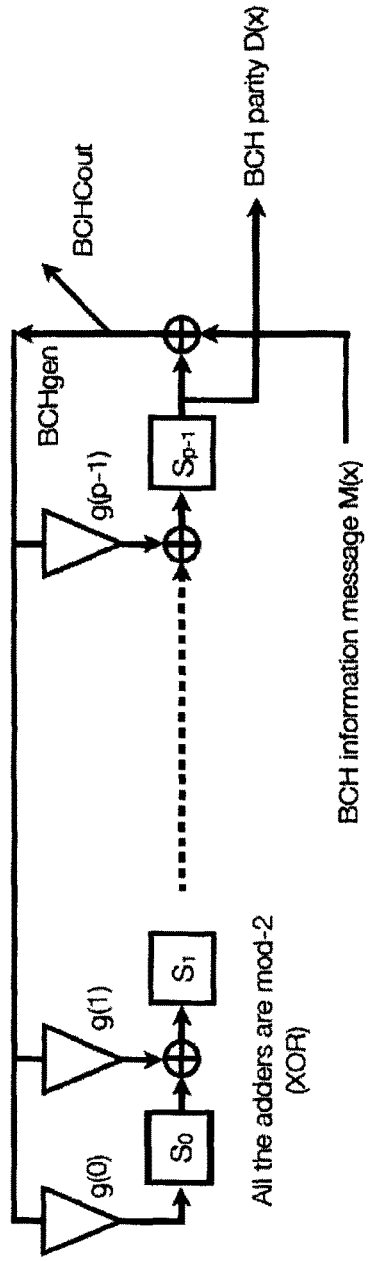
FIG. 7 is a block diagram illustrating a systematic BCH encoder.

FIG. 7 illustrates a BCH systematic encoder. The parity is transmitted after the information message M(x). The encoder computes the parity in two steps. The first step is multiplication of M(x) with $x^{n-k}$. The second step is defining the parity portion D(x) as the reminder of division of M(x)·$x^{n-k}$ by G(x). The delay elements $S_0, S_1, \ldots S_{p-1}$ shall be initialized to zero before encoding. All the k bits composing the information message M(x) are used to calculate the parity D(x) with the switch connected (BCHgen position set). After all the k bits have been serially processed, the switches disconnected (BCHout position set) and the p stored values $S_0, S_1, \ldots S_{p-1}$ are the parity bits D(x). The parity bits are then transmitted in the order from $S_{p-1}$ to $S_0$.

The codewords with $n_c(1)$ bits resulting from the BCH encoding are then mapped by means of a 16-QAM Gray mapper 430, which maps with the number of coded bits per dimension $n_b(1)$=2 bit/dimension. The second level remains uncoded and the $k_c(2)$ bits are directly mapped by mapper 450 into an 8-QAM $RZ^2$ lattice constellation with $n_b(2)$=1.5 bit/dimension.

After the above described mapping, each of the two levels produces the same number of symbols per two dimensions $N_{MLCC}/2$. The lattice transformations 440 and 460 are defined to implement coset partitioning. After the addition following the first-stage lattice transformations 440 and 460, the symbols are contained in $Z^2$. Furthermore, a next lattice transformation 470 results in a final zero-mean two dimensional square constellation over $RZ^2$ lattice. Finally, the PAM modulator 480 generates PAM symbols based on the two dimensional square constellation.

In the following, the above mentioned mappers and lattice transformations are described in more detail in accordance with an embodiment of the present invention. It is noted that although the following architecture provides an advantage of an efficient implementation, for instance, in an integrated circuit, the present invention is not limited thereto and any alternative implementation of these functions may be employed.

Figure 8B:
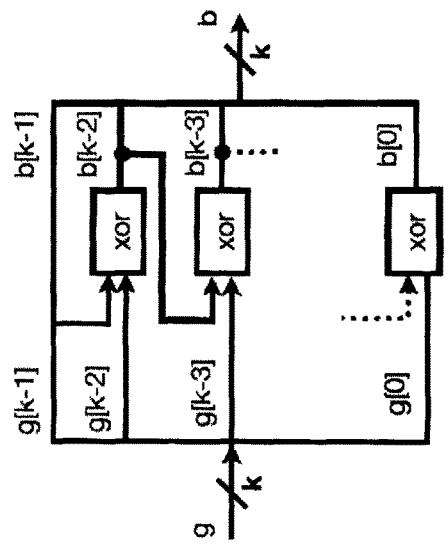
FIG. 8B is a block diagram illustrating an implementation of a Gray-to-Binary mapper.
Figure 8A:
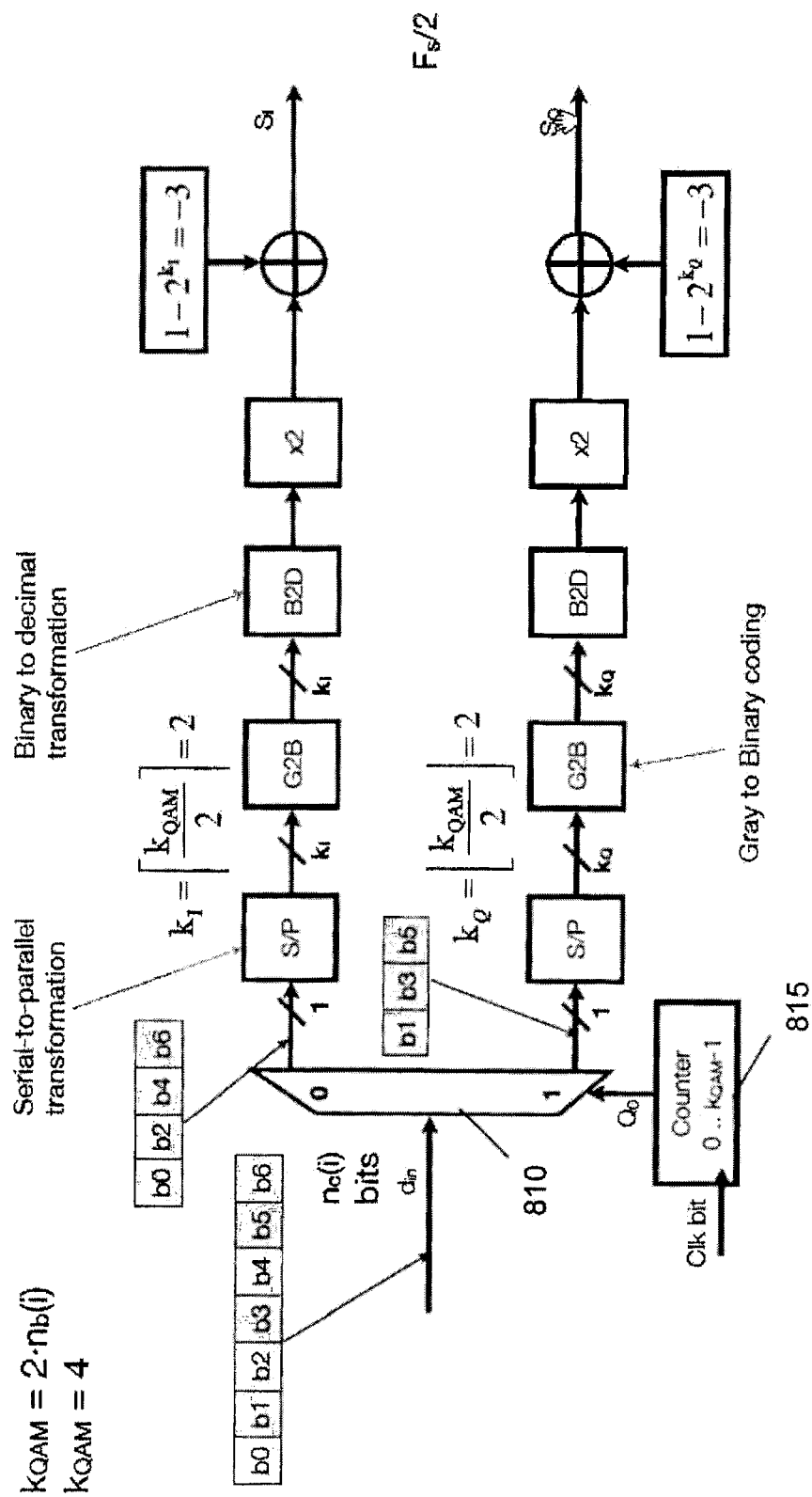
FIG. 8A is a block diagram illustrating architecture of a 16-QAM mapper for the first level.

FIG. 8A illustrates the details of the 16-QAM Gray mapper 430. The mapper maps coded bits onto points of a predefined constellation. For the i-th level (i=1, 2) $k_{QAM}$=$2 \cdot n_b(i)$ bits per 2 dimensions. In particular, for the present case, $k_{QAM}$=4 and the mapper works as follows.

The input bit stream with $d_{in}$=$n_c(1)$ bits is demultiplexed into two substreams. One of the substreams maps onto the in-phase (I) component of the two-dimensional constellation and the other substream maps onto the quadrature (Q) component of the constellation. The in-phase component corresponds to a real part of a complex symbol and the quadrature part corresponds to an imaginary part of the complex symbol. The consecutive input bits $d_{in}$ are assigned to the respective components bit-wise in an interleaved manner.

For instance, as shown in FIG. 8A, each even bit (b0, b2, b4, b6, . . . ) is assigned to the first substream and each odd bit (b1, b3, b5, . . . ) is assigned to the second substream. The demultiplexer 810 is controlled by the least significant bit (LSB) of a free counter 815 counting from 0 to $k_{QAM}-1$ clocked at the same input bit rate. The reset state of the counter should be zero. Since the counter is reset for each set of $k_{QAM}$ bits, for each new codeword it always starts at zero.

Since $k_{QAM}$ is even, the same number of bits are assigned to each component, which is here the case. The number of bits per dimension assigned to each component is $$k_I = \left\lceil \frac{k_{QAM}}{2} \right\rceil, \text{ and } k_Q \left\lfloor \frac{k_{QAM}}{2} \right\rfloor,$$

wherein $\lceil . \rceil$ denotes rounding up and $\lfloor . \rfloor$ denotes rounding down. In the present case it follows that $k_I=k_Q=2$.

In the two substreams, the bits are then converted from serial to parallel (S/P) to symbols with $k_I$ and $k_Q$ bits in the in-phase and quadrature component, respectively. S/P shown in the figure is a serial-to-parallel transformation performed in such a way that the first received bit in the input belonging to a group of k bits is assigned to the LSB of the parallel output, and the last received bit of the group to the MSB in other words, the right bit is the most significant bit.

Then, a Gray-to-Binary converter (G2B) is applied. An example of a Gray-to-Binary converter is shown in FIG. 8B. The input bus g and output bus b are parallel buses with the width of k ($k_I$ and $k_Q$, respectively). The converter assigns for each $j \in [1, k-1]$:

$$b[k-1]=g[k-1]$$

$$b[k-1-j]=g[k-1-j] \oplus b[k-j]$$

wherein "$\oplus$" denotes the exclusive or (xor) operation, or modulo 2 addition.

The binary bus resulting from the Gray-to-binary conversion are then processed as shown further in FIG. 8A by means of unsigned binary to decimal converter (B2D). Let the [x(0) . . . x(k-1)] be the parallel input, where x(i) is the value for each bit of the bus and x(0) is the LSB and x(k-1) is the MSB. Then, the integer output of the B2D is defined such that $$d=2^{x(0)}+2^{x(1)}+ \ldots +2^{x(k-1)}$$

For constellations where $k_I=k_Q$, the arithmetic operations carried out on both branches (I and Q components) are same. This is the case, for instance, for square Gray Quadrature Amplitude Modulation (QAM) constellations. The term "x2" means multiplication by 2.

The 8-QAM $RZ^2$ lattice mapper 450 for the second level is illustrated in FIG. 4. For the i-th level (i=1, 2) $k_{QAM}=2 \cdot n_h(i)$ bits per 2 dimensions. In particular, for the present case, $k_{QAM}=3$ and the mapper works as follows.

Similarly to the mapper 430 described above, the input bit stream with $d_{in}=n_c(1)$ bits is demultiplexed into two substreams. One of the substreams maps onto the in-phase (I) component of the two-dimensional constellation and the other substream maps onto the quadrature (Q) component of the constellation. The in-phase component corresponds to a real part of a complex symbol and the quadrature part corresponds to an imaginary part of the complex symbol. The consecutive input bits $d_{in}$ are assigned to the respective components bit-wise in an interleaved manner.

Figure 9:
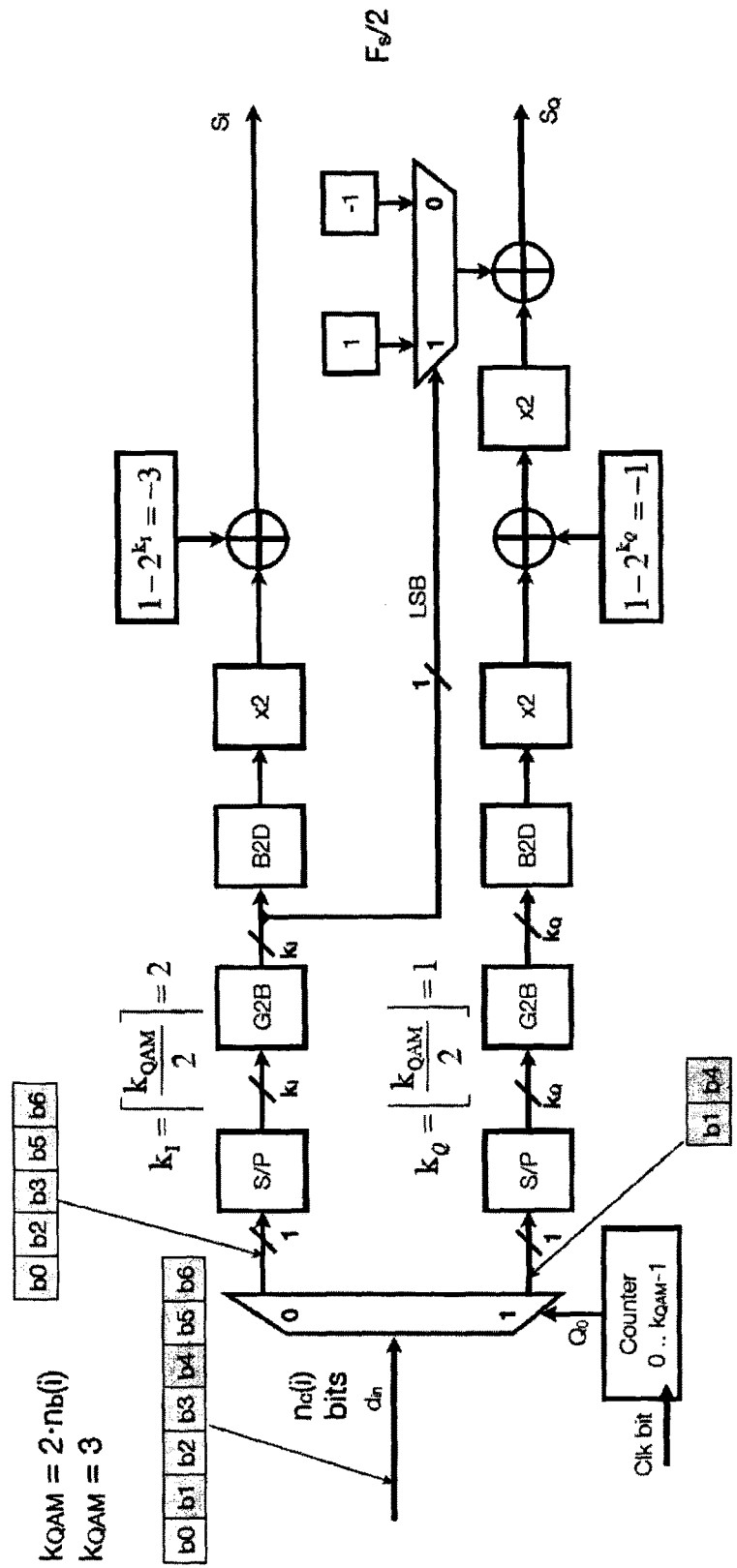
FIG. 9 is a block diagram illustrating architecture of a 8-QAM mapper for the first level.

As shown in FIG. 9, the input bits are split bit-wise by cyclically assigning one bit to the second substream and two bits in the first substream. In particular, as can be seen in the figure, the first substream includes bits b0, b2, b3, b5, b6, etc. whereas the second substream includes bits b1, b4, b7, etc. The demultiplexer is controlled by the least significant bit (LSB) of the counter counting from 0 to $k_{QAM}-1$ clocked at the same input bit rate. Here, $k_{QAM}$ is odd, so that the in-phase component receives more bits that the quadrature component. Thus, the number of bits per dimension assigned to each component is $$k_I = \left\lceil \frac{k_{QAM}}{2} \right\rceil, \text{ and } k_Q \left\lfloor \frac{k_{QAM}}{2} \right\rfloor,$$

wherein $\lceil . \rceil$ denotes rounding up and $\lfloor . \rfloor$ denotes rounding down. In the present case it follows that $k_I=2$ and $k_Q=1$.

In the two substreams, the bits are then converted from serial to parallel (S/P) to symbols with $k_I$ and $k_Q$ bits in the in-phase and quadrature component, respectively.

The least significant bit (LSB) $b_0$ output from the G2B in the in-phase component is used to control the multiplexer which sets 1 or -1 to the input of the last adder. For $k_I > k_Q$, as is here the case, the Q branch is thus transformed to generate a rotated almost Gray QAM $RZ^2$ constellation, required to map an odd number of bits per two dimensions.

After the mapping, the symbols output from the respective mappers in each of the two MLCC levels are further transformed by a lattice transformation, which performs coset partitioning. The entire lattice transformation is composed by three sub-operations:
1) The lattice is translated to allow the constellation to be contained within the first two-dimensional quadrant,
2) The lattice is scaled to enable the coset partitioning by vector addition with the constellation of the other level,
3) The lattice is rotated by 45 degrees before the vector addition for constellations with an odd number of bits per two dimensions, i.e. (sub)sets of $nRZ^2$.

The translation denoted here as $\Lambda_{1,1}{}^t(l)$ is defined for each $x \in C$ (x is a complex number), wherein $j=\sqrt{-1}$, l is the level in which the transformation is used (1 or 2) and i denotes level of the MLCC, as $$\Lambda_{1,1}{}^t(l)(x)=x+(1+j)(2^{\lceil n_b(l) \rceil}-1).$$

Scaling and rotation are grouped into a single sub-operation denoted $\Lambda_{1,2}{}^t(l)$ and defined for each $x \in C$ as $$\Lambda_{1,2}^t(l)(x) = \frac{1}{2} x \cdot 2^{\sum_{i=1}^{l-1} \lceil n_b(i) \rceil} \cdot \left( \frac{1+j}{2} \right)^{rem(2n_b(l),2)},$$

wherein operation "rem" denotes a reminder after an integer division. In particular, the above formula, it is a reminder of division of the first operand ($2n_b(l)$) by the second operand (2).

The complete lattice transformation $\Lambda_1{}^t(l)$ including translation, scaling and rotation is defined as $$\Lambda_1{}^t(l)(x)=\Lambda_{1,2}{}^t(l)(\Lambda_{1,1}{}^t(l)(x)).$$

Figure 10:
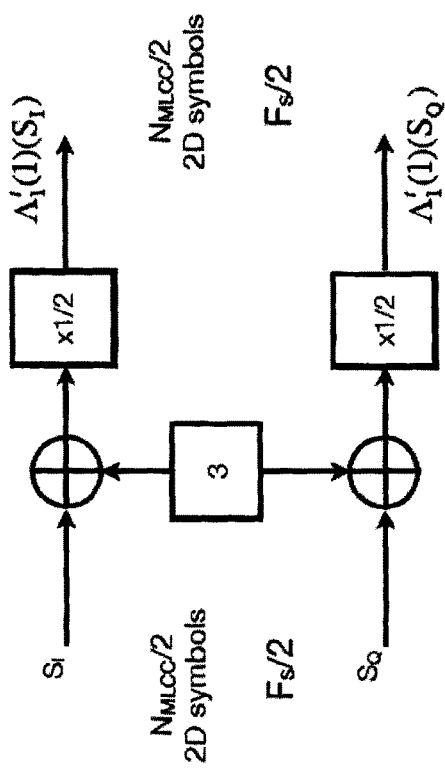
FIG. 10 is a block diagram illustrating an example of the lattice translation operation for a first level of the first stage.

The lattice transformation 440 for the first level does not include rotation since $n_b(1)=2$ bit/dim. The corresponding lattice transformation architecture is shown in FIG. 10. The input and output signals for each component branch are considered integer numbers and arithmetic operations are defined with natural bus width increase. The output of the mapper, symbols $S_I$ and $S_Q$ are input to the lattice transformator 440.

Figure 11:
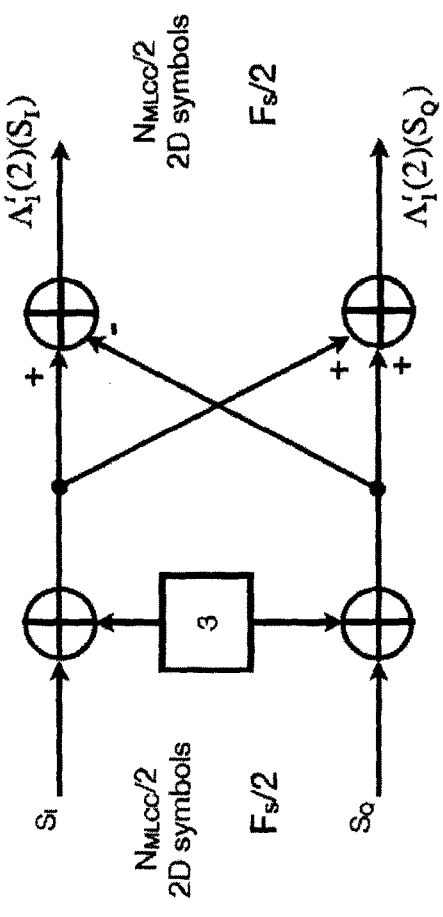
FIG. 11 is a block diagram illustrating an example of the lattice translation, scaling and rotation operation for a second level of the first stage.

For the second level, the lattice transformation 460 is performed. Since $n_b(2)=1.5$ bit/dim the rotation is performed since the corresponding 2D constellation maps 3 bit per two dimensions (odd number). The lattice transformation 460 of second level also includes scaling for coset partitioning implementation. The second level lattice transformation architecture is illustrated in FIG. 11.

Figure 12:
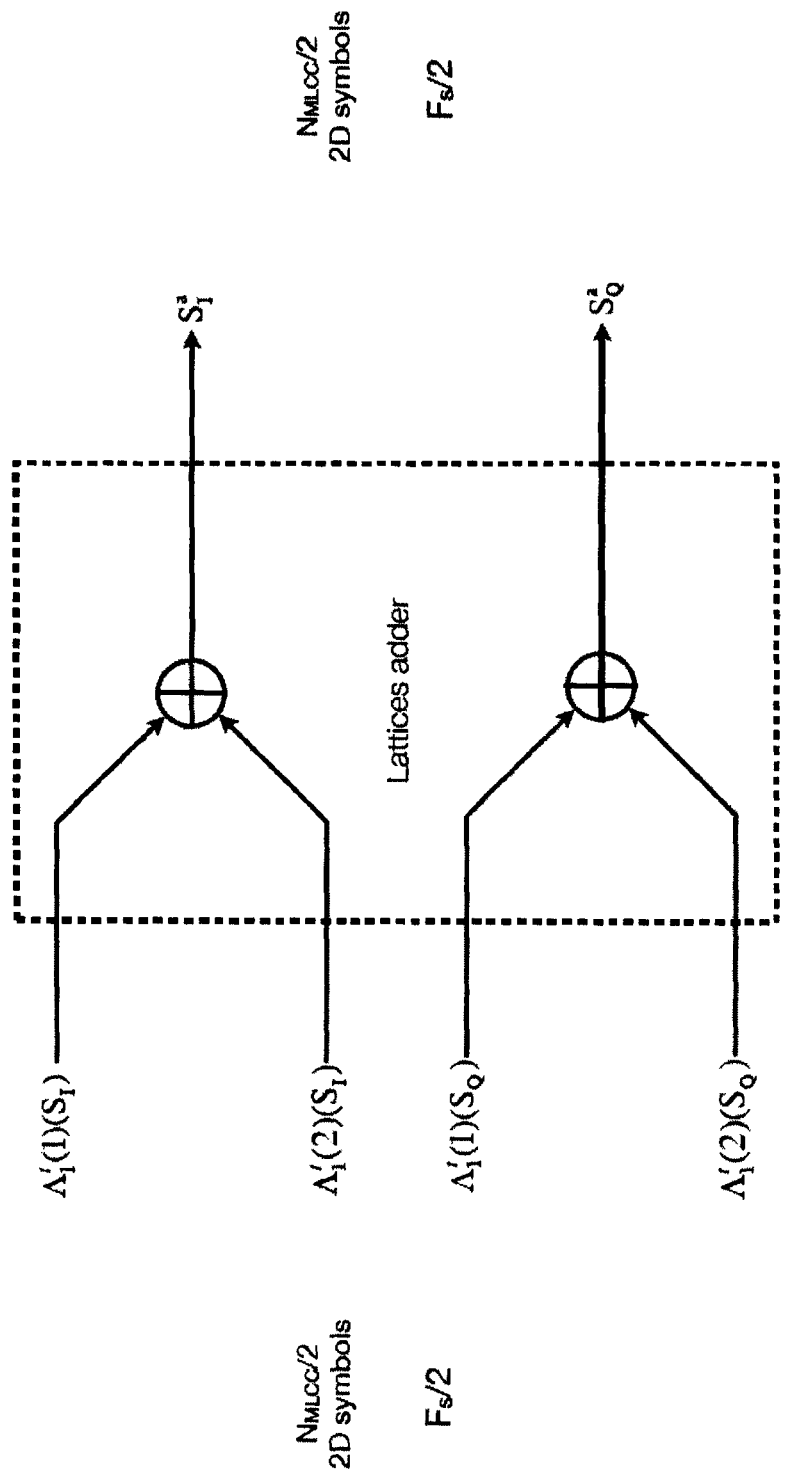
FIG. 12 is a block diagram illustrating an example of the lattice adder (vector addition) implementation.

After performing the first-stage lattice transformations 440 and 460, the lattice transformed symbols from each of the two levels are added thus performing the coset partitioning over lattice $Z^2$ and the final partitioning (labeling). In particular, the in-phase and the quadrature components from the three levels are added separately to generate a respective new in-phase component $S_I^a$ and quadrature component $S_Q^a$ as illustrated in FIG. 12.

The symbols with in-phase component $S_I^a$ and quadrature component $S_Q^a$ output from the lattice adder are further transformed in order to obtain the final zero-mean two-dimensional square constellation over $RZ^2$. The second-stage lattice transformation 470 includes the following three steps:
1) Rotation by −45 degrees,
2) Modulo operation which constrains the constellation points to a square region within the first 2D quadrant, and
3) centering (to achieve zero mean) and scaling.

In particular, the second-stage lattice transformation is given by:

$$\Lambda_2^t(x) = 2 \cdot \text{mod}(x \cdot (1-j)^{rem(2\xi,2)}, 2^{\lceil \xi \rceil}) + (1+j) \cdot (1-2^{\lceil \xi \rceil})$$

for each $x \in C$ (x is a complex number), wherein $j=\sqrt{-1}$ and with the modulo operation being defined as:

$$\text{mod}(y, x) \triangleq y - x \left\lfloor \frac{y}{x} \right\rfloor$$

The symbol $\xi$ represents the total number of coded bits per dimension:

$$\xi = \sum_{i=1}^{2} n_b(i)$$

Figure 13:
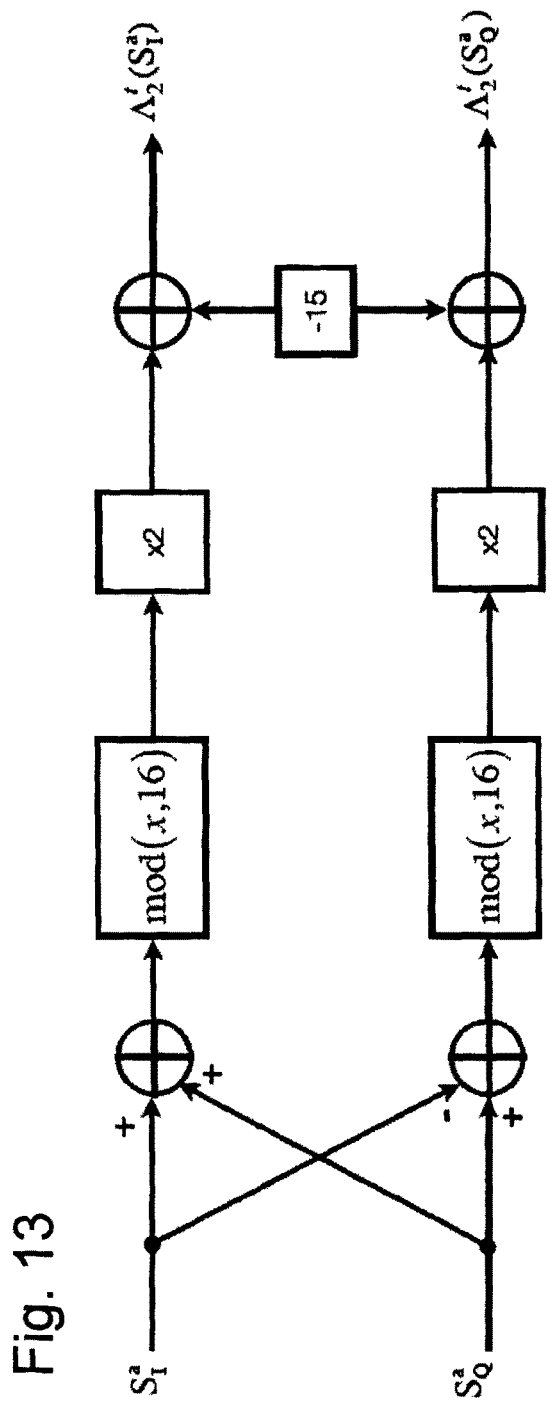
FIG. 13 is a block diagram illustrating an example of a second-stage lattice transformation.

This lattice transformation is illustrated in FIG. 13. As can be seen in FIG. 13, the first part implements the rotation by −45 degrees. The modulo operation is applied afterwards to constraint the symbols to a square constellation in the first 2D quadrant. Then the scaling (by 2) and centering of the constellation is performed, resulting in the final zero-mean square rotated QAM constellation. The transformed symbol components $\Lambda_2^t(S_I^a)$ and $\Lambda_2^t(S_Q^a)$ take odd values.

Figure 14:
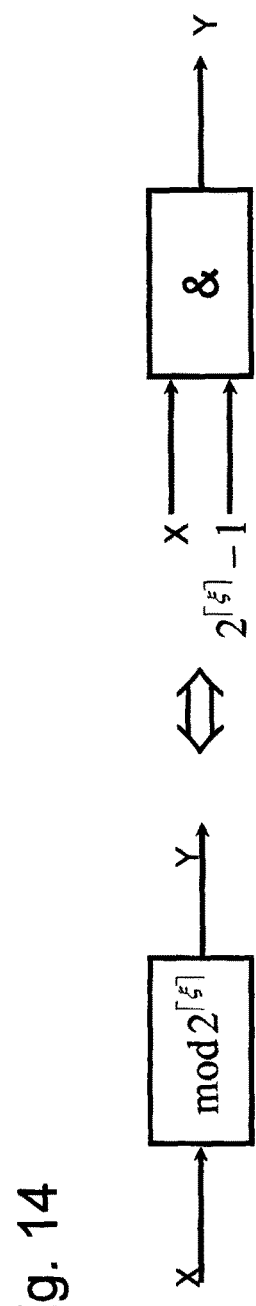
FIG. 14 is a block diagram illustrating an example implementation of a modulo operation.

Since in the above lattice operation formula, $x=2^{\lceil \xi \rceil}$, the modulo operation can be defined by means of a logic "and" operation as illustrated in FIG. 14. FIG. 14 shows the operation $Y=\text{mod}(X, 2^{\lceil \xi \rceil})$ performed equivalently as binary $Y=X \& (2^{\lceil \xi \rceil}-1)$.

The in-phase and the quadrature components $\Lambda_2^t(S_I^a)$ and $\Lambda_2^t(S_Q^a)$ of the 2D symbols output from the second-step lattice transformation are then time domain multiplexed resulting in a sequence of 1D symbols belonging to a $2^{\lceil \xi \rceil}$-PAM constellation, here the 16-PAM constellation. These symbols are either directly transmitted to the communication channel or precoded, for instance by the THP as described above.

Figure 15:
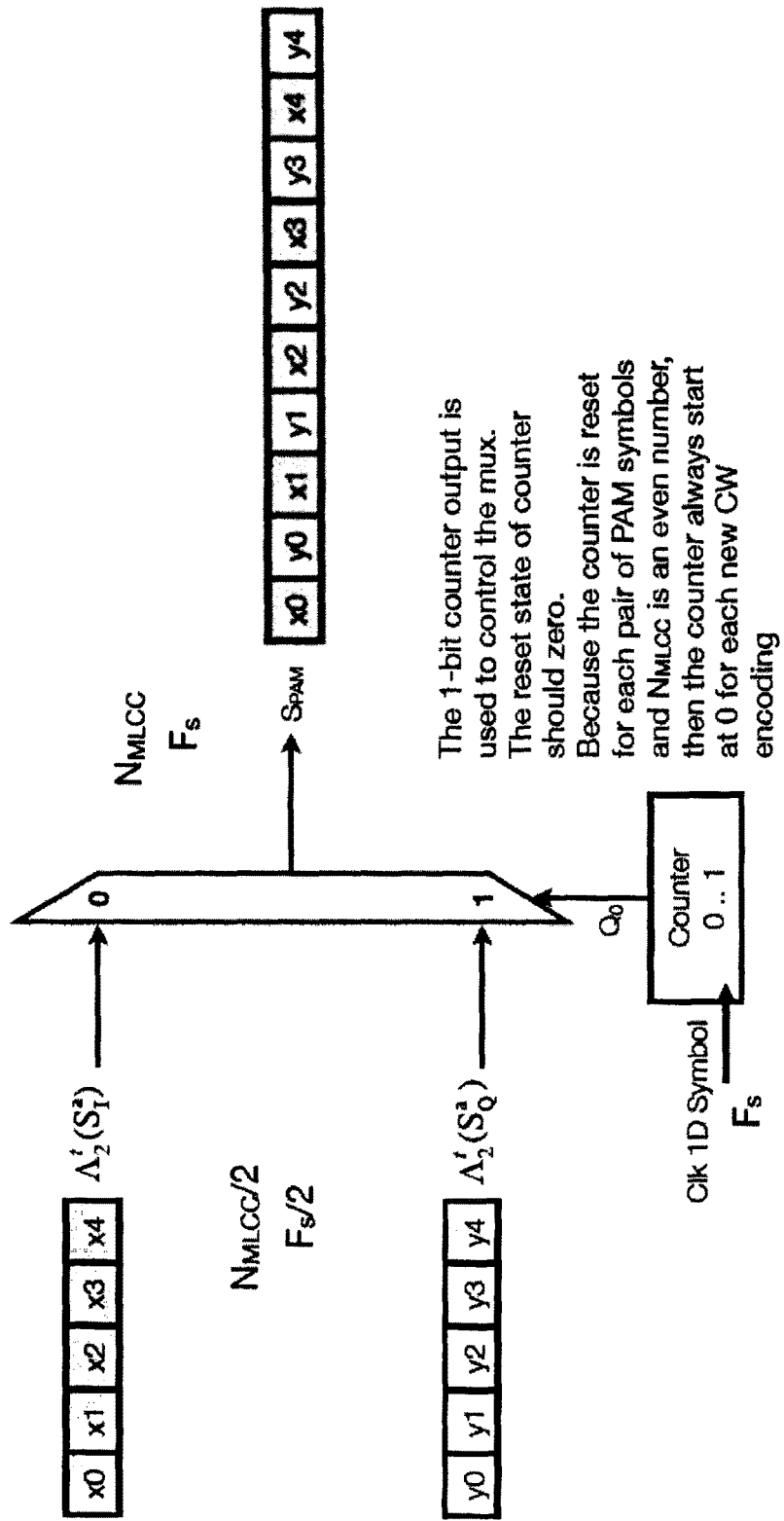
FIG. 15 is a block diagram illustrating M-PAM modulation output.

The multiplexing operation performed by the $RZ^2$ to PAM multiplexer 480 is illustrated in FIG. 15. A free counter from 0 to 1 is clocked at the 1D symbol rate (Fs represents symbol rate, i.e. baud rate) and controls the input of the multiplexer to take alternatingly the in-phase and quadrature input symbols. The 16-PAM symbols belong to the set {−15, −13, . . . , 13, 15}.

The number of bits per PAM constellation point at the encoder output is $k_{PAM} = \lceil \xi \rceil = 4$.

Figure 16A:
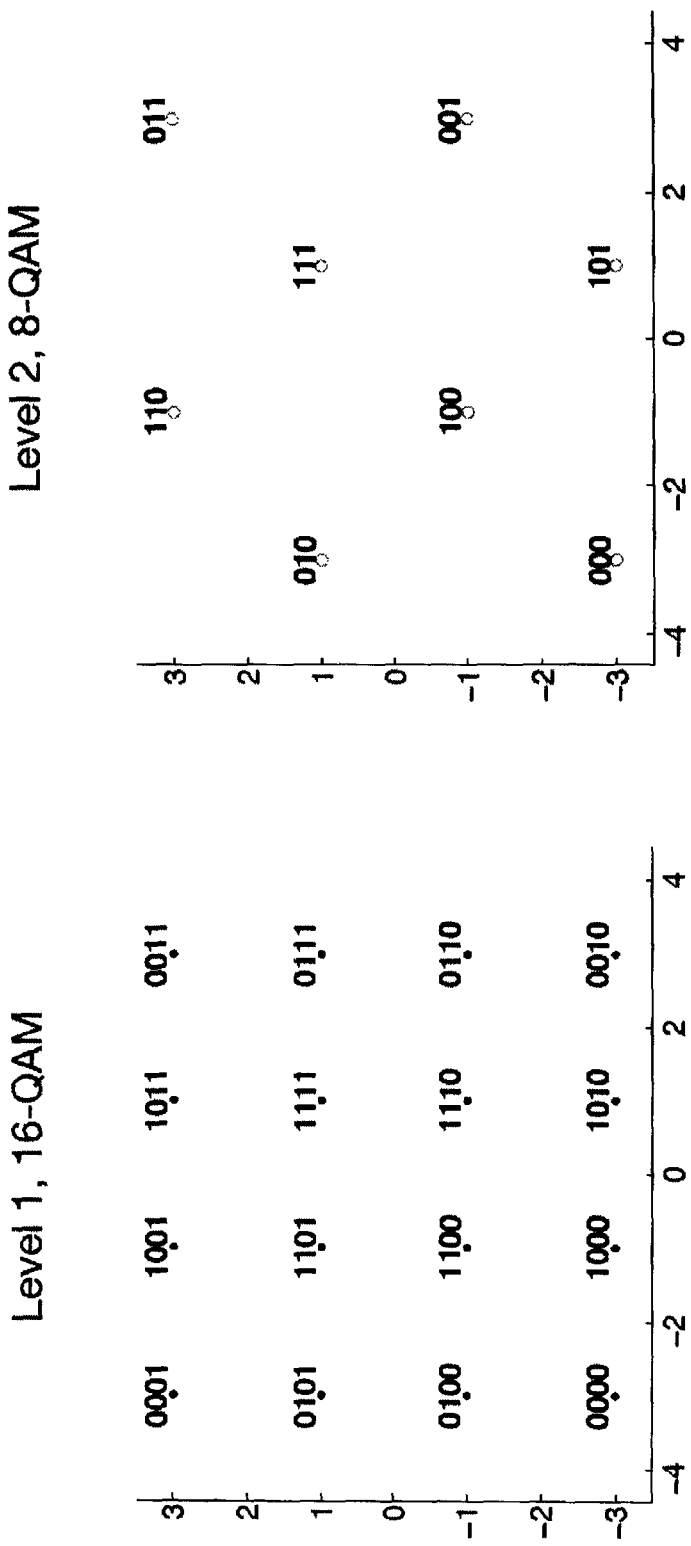
FIG. 16A, 16B are schematic drawings illustrating the constellation diagram after first-stage and second-stage lattice transformations.
Figure 16B:
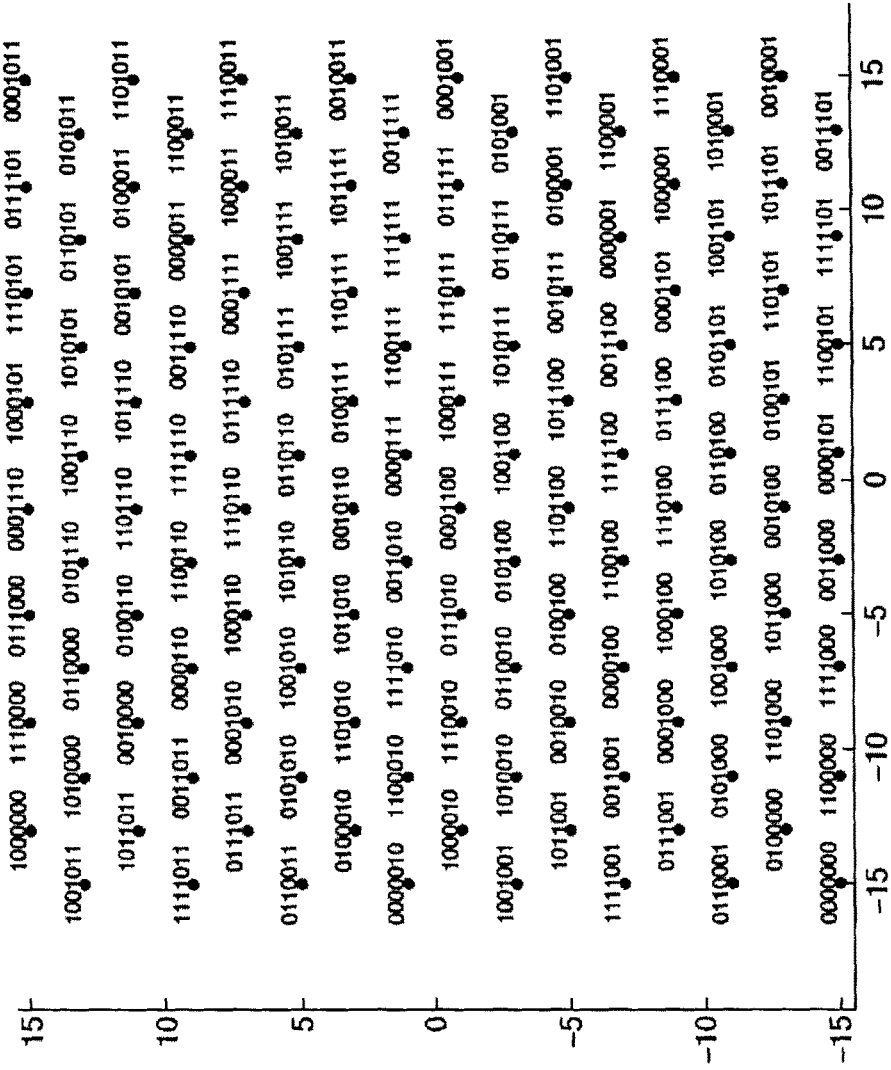

In the following, the mapping and lattice transformation effect on the symbol constellations are visualized in FIGS. 16A and 16B. In particular, on the left hand side of FIG. 16A, the constellation of the first level after mapper 430 is shown whereas on the right hand side of FIG. 16A, the constellation of the second level after the mapper 450 is shown. FIG. 16B shows the constellation after the respective lattice transformation 440 and 460 and after the vector addition, and the second-stage lattice transformation 470, resulting in a rotated 128-QAM.

There are 128 points in the 2D constellation, which results in $\log_2(128)=7$ bits/2D symbol. These seven bits are composed by 4 bits of 1st MLCC level and 3 bits of 2nd MLCC level. Each 2D symbol is transmitted at a rate of Fs/2. To transmit over 1D (i.e. intensity modulation of LED), the system does time interleaving of both coordinates of 2D constellation at double rate, that is Fs. Each 2D point can be represented by 2 coordinates that can take 16 different values each one: {−15, −13, . . . 13, 15}. This is 16-PAM, but encoding by 3.5 bits/1D symbol (i.e. 7 bits/2D) instead of 4 bits as usual, since the 1D constellation was generated from odd bits 2D constellation. The 3.1883 bits of 3.5 are information bits, the rest is parity for error correction.

Accordingly, 1 codeword with $\alpha_{MLCC}=3150$ bits is coded by the two-level coder as shown in FIG. 4 into $N_{MLCC}=988$ PAM symbols when using the BCH (1976, 1668) as exemplified above. Moreover, Fs is advantageously equal to 325 MHz, $\eta=3.31883$ bits/s/Hz/dim and $\xi=3.5$ bits/dim.

Figure 17:
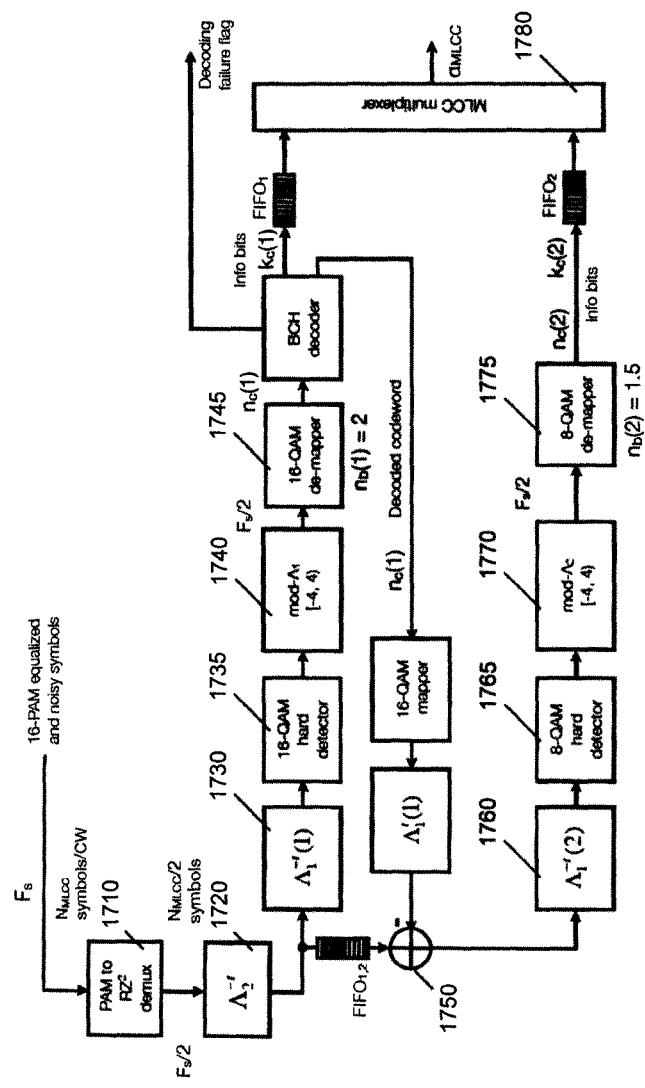
FIG. 17 is a block diagram of a decoder with a two-level coset decoding and demodulation.

FIG. 17 shows an example multi-stage decoder which may be used to decode signal encoded as described above. First, the encoded digital signal (16-PAM) having a length $N_{MLCC}$ per codeword and baud rate Fs, is demodulated and demultiplexed 1710 to obtain a 2 dimensional symbol codeword with length $N_{MLCC}/2$ and Fs/2. The demodulated symbol is then transformed by an inverse second-stage lattice transformation 1720 (matching the second-stage lattice transformation 470 of the encoder) and decoded with a two-stage decoder. The two-stage decoder applies in the first level another inverse first-stage lattice transformation 1730 (matching the lattice transformation 440 at the encoder) and hard decision 1735, then extracts a first portion of the transformed symbol codeword by applying 1740 a modulo operation (mod-$\Lambda_1$) to the demodulated symbol. Then, still in the first level, the extracted first portion is demapped 1745 (matched to mapping 430 at the encoder with 16-QAM) to obtain $n_c(1)$ bit long BCH codeword, which is decoded with a BCH decoder (matched to the BCH coder 420 at the encoder) to obtain kc(1) information bits.

The decoded codeword of the first portion with $n_c(1)$ bits selects a first coset. The decoded codeword of the first portion is then mapped back 430 similarly as and transformed by a lattice transformation corresponding to 440. The resulting first-level coset is then subtracted 1750 from the received symbol codeword and the second portion is obtained in the second level by applying modulo operation (mod-$\Lambda_2$) thereto 1770 after an inverse lattice transformation 1760 and hard decision 1765, which are similar to functional blocks described for the first stage. The second portion is then demapped 1775 (matched to mapping 450 at the encoder) to obtain $n_c(2)=k_c(2)$ bit long uncoded codeword. The codeword is finally decoded by multiplexing 1780 (MLCC mux) the decoded two parts obtained at two decoder levels to obtain the decoded word of length $\alpha_{MLCC}$.

The decoder as shown in FIG. 17 includes three FIFOs, namely FIFO1,2; FIFO1 and FIFO2. The input rate of the decoder is 1 symbol (16-PAM) for cycle whereas the output rate is correspondingly to the input rate of the encoder 3150/988=3.1883 bits per cycle at 325 MHz. The latency is mainly introduced by the FIFOs and by the BCH decoder. The remaining blocks have simpler implementation with nearly no latency.

In order to minimize the FIFO1,2 size without impacting the BER of neither $1^{st}$ nor $2^{nd}$ level, the output from the BCH decoder is advantageously fed back to the second stage as soon as the error correction has been carried out (Berlekamp, Chien) without waiting for the decoding failure checking. Chien's search runs calculating the roots of the Error Locator Polynomial (ELP) in parallel to the output, flipping the bits of which the location evaluates the ELP to zero. After all the ELP roots have been calculated, the BCH decoder compares the number of roots found during Chein's search against the ELP degree. In case of being different, decoding failure is asserted, indicating that the error correction capability of the decoder has been exceeded. An eight parallel Chien's search architecture is used to speed up this process, further reducing the latency.

FIFO1,2 is located between the two decoding levels (stages) to store the received symbols from the channel waiting for the first level decoding. FIFO1,2 size in number of symbols is determined by the delay of BCH decoder (in number of cycles) for error correction. Thus, FIFO1,2 performs with a constant filing level being the input rate equal to the output rate in steady state of 0.5 2D symbols per cycle, after ramp-up.

Figure 19A:
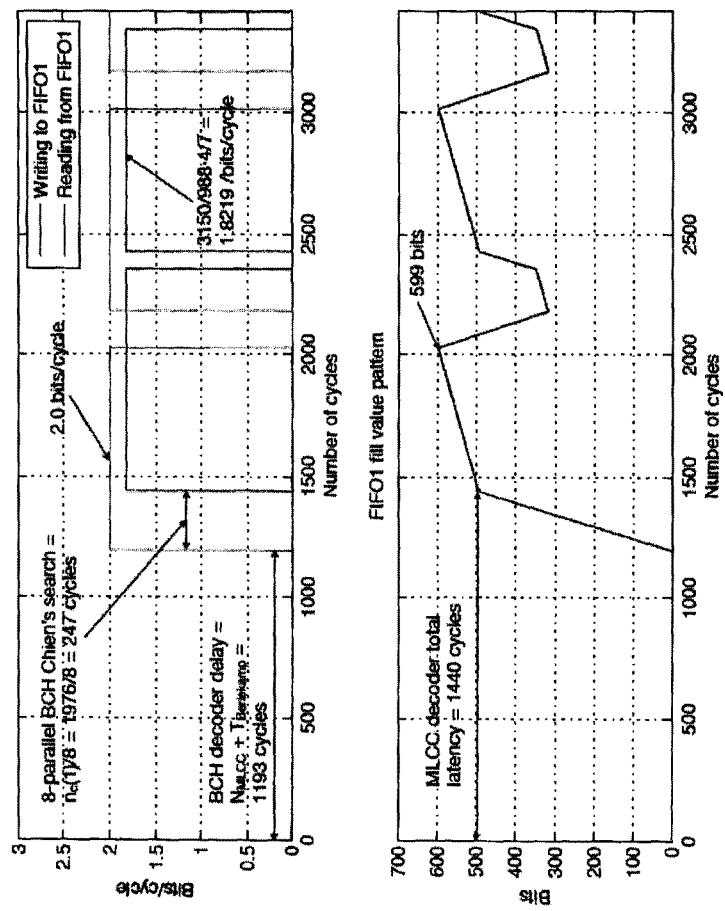
FIG. 19A, 19B are graphs illustrating operation of FIFO1 and FIFO2 of the decoder.
Figure 19B:
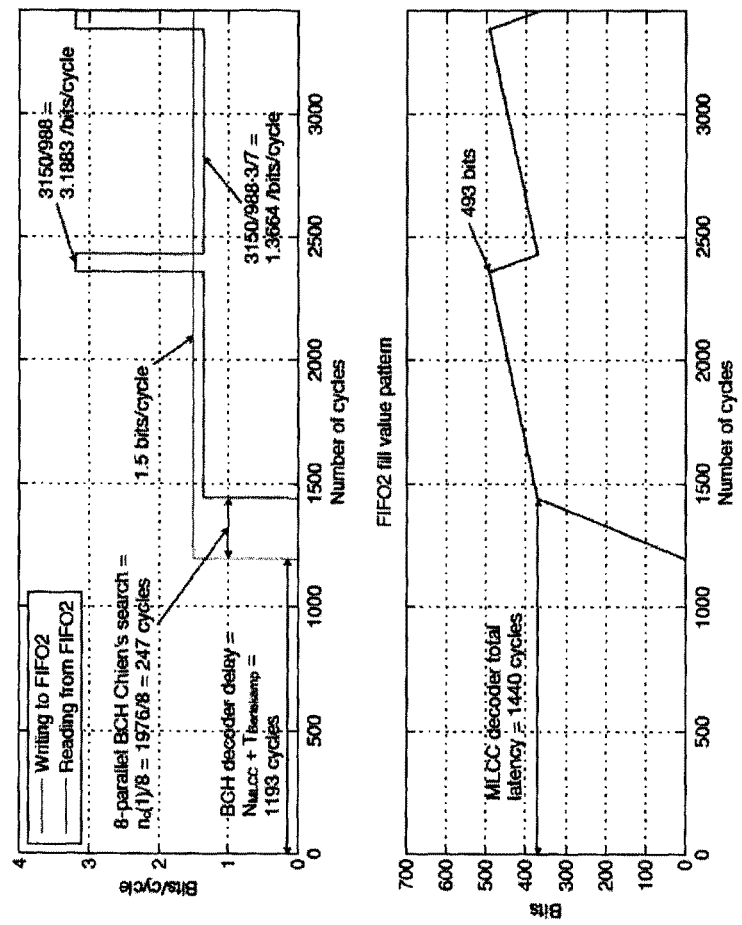

FIFO1 and FIFO2 are in charge of rate matching between both the input and the output of the multi-stage decoder. Processing delay required by the BCH decoding failure detection is going to be supported by FIFO1. Thus, an extra stock in FIFO1 may be implemented to synchronize the decoded information data of the first level with the end of the error detection processing by BCH decoder that validates the failure flag. The latency of FIFO1 and FIFO2 in the decoder are shown in the respective FIGS. 19A and 19B. As can be seen from the figures, the decoder latency is 1440 cycles, corresponding to 4.43 microseconds (µs) for Fs=325 MHz. The memory requirements are 599 bits for FIFO1, 493 bits for FIFO2, and 1193 symbols for FIFO1,2. It may be considered that there are 8 bits per symbol, taking into account that constellation expansion produced by THP has to be allocated. With such an assumption, 9544 bits are necessary for FIFO1,2.

In summary, the latency of coded 16-PAM MLCC encoder is 0.27 µs whereas the latency of the corresponding decoder is 4.43 us. The total latency is 4.71 µs. Latency of the rest of the physical layer (transmission structure, equalizers, etc) is calculated as <1.3 ρs. Accordingly, PHY GMII-to-GMII latency remains below 6 ρs. Based on the above, memory requirements for the encoder are ca. 300 bits whereas the memory requirements for the decoder are ca. 10.6 kbits. These numbers take into account only the FIFOs. Internal memories of the BCH decoder are not considered, but their size is estimated ca. one order of magnitude smaller than the FIFOs. As can be seen above, FIFO1,2 is the most memory demanding block of the decoder.

Figure 21:
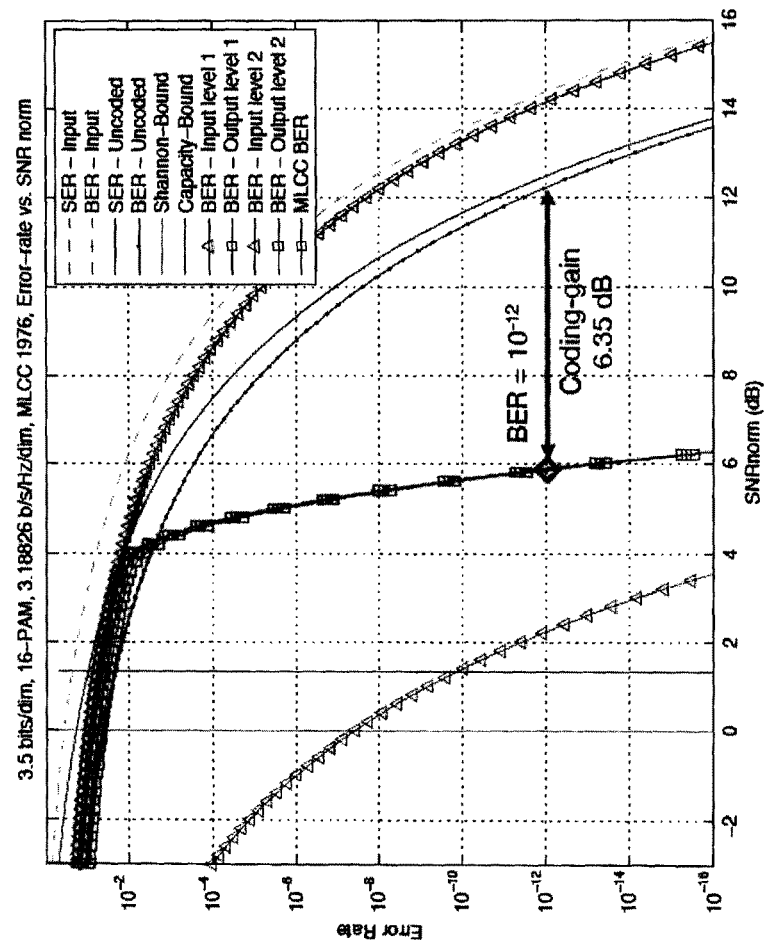
FIG. 21 is a graph illustrating the performance of the MLCC in terms of BER over SNR.

The performance of the MLCC described above using the BCH (1976, 1668) is illustrated in FIG. 21, which shows the Bit Error Rate (BER) over the signal to noise ratio (SNR) achieved by the MLCC. Bit Error Ratio: is the ratio between the number of received errored information bits and the total number of received information bits (correct and errored ones) in average. As can be seen from the Figure, for the BER of 10e-12, the coding gain achieved by the MLSS is 6.35 dB, thus rather high.

FIG. 22 shows the link budget, the MTTFPA and MTBE (Mean Time Between Errors) as a function of BER. MTEB is defined for a system with FEC as the mean time between bursts, which corresponds with the magnitude that is measurable in the lab.

It is noted that the hard decision may be implemented for the detection of symbols at each decoding level. For separating the received information corresponding to each level, modulo operators may be implemented as defined in G. D. Forney et al., "*Sphere-bound-achieving coset codes and multilevel coset codes*", IEEE Trans. on Information Theory, vol. 46, no. 3, May 2000, pp. 820-850. Bounded-distance decoding such as the Berlekamp-Massey Algorithm (BMA), may be used for BCH decoding. BMA is widely used for BCH decoding in hardware implementations.

The above discussed MLCC with BCH (1976, 1668) designed for the POF channel provides advantages of a rather small latency, because the system requires smaller FIFOs in transmitter and receiver in particular thanks to the interleaved multiplexer and the low number of levels (only 2). Moreover, the employment of BCH rather than LDPC simplifies the coding and decoding and also lowers the power consumption as well as silicon area necessary for implementation. Moreover, BCH codes do not have error floor, typically produced by probabilistic codes like LDPC. The Error detection (in addition to correction) capabilities of BCH are well understood in the state of art, to provide high Mean Time To False Packet Acceptance (MTTFPA).

Summarizing, the present invention relates to an efficient coding and modulation system for transmission of digital data over plastic optical fibers with low latency. In particular, the digital signal is coded by means of a two-level coset coding. The first level applies to the digital data a binary shortened BCH coding and performs coset partitioning by means of constellation mapping and lattice transformations. The second level is uncoded but undergoes mapping and lattice transformation. After an addition of the two levels, a second-stage lattice transformation is performed so as to obtain a zero-mean constellation. The symbols output from such three-level coset coder are then further modulated.

Another embodiment of the invention relates to the implementation of the above described various embodiments using hardware and software. It is recognized that the various embodiments of the invention may be implemented or performed using computing devices (processors). A computing device or processor may for example be general-purpose processors, digital signal processors (DSP), application specific integrated circuits (ASIC), field programmable gate arrays (FPGA) or other programmable logic devices, etc. The various embodiments of the invention may also be performed or embodied by a combination of these devices.

Further, the various embodiments of the invention may also be implemented by means of software modules, which are executed by a processor or directly in hardware. Also a combination of software modules and a hardware implementation may be possible. The software modules may be stored on any kind of computer readable storage media, for example RAM, EPROM, EEPROM, flash memory, registers, hard disks, CD-ROM, DVD, etc.

What is claimed is:

1. A method for coding digital data for transmission over a plastic optical fiber, the method comprising the steps of:
   coding input digital data by a two-level coset coding including:
   separating the input digital data only into a first portion and a second portion of data, each with a predetermined number of bits including cyclically assigning a first predetermined number of bits to the first portion and a second predetermined number of bits to the second portion;
   coding the first portion of data with a first shortened BCH code in a first level;
   in the first level, mapping the coded first portion onto symbols of a first predefined multilevel quadrature amplitude modulation constellation and performing a first-stage lattice transformation of the mapped symbols so as to achieve coset partitioning;
   in the second level, mapping the second portion onto symbols of a second predefined multilevel quadrature amplitude modulation constellation and performing the first-stage lattice transformation of the mapped symbols;
   adding the transformed symbols from the first and the second level;
   performing a second-stage lattice transformation for achieving a zero-mean constellation,
   modulating the symbols encoded with the two-level coset coding using a multilevel pulse amplitude modulation including time multiplexing the in-phase and quadrature output of the second-stage lattice transformation in time domain,
   wherein the first predefined multilevel quadrature amplitude modulation constellation is 16-QAM with Gray mapping whereas the second predefined multilevel quadrature amplitude modulation constellation is 8-QAM with $RZ^2$ lattice mapping.

2. The method according to claim 1, wherein the first-stage lattice transformations include translation, scaling and/or rotation of a symbol, and/or
   the second-stage lattice transformation includes rotation of a constellation; and/or modulo operation for constraining constellation symbols to a square region in a first 2D quadrant; and/or centering and scaling.

3. The method according to claim 1, wherein the multilevel pulse amplitude modulation is 16-PAM.

4. The method according to claim 1, further comprising a step of Tomlinson-Harashima precoding applied to the modulated symbols.

5. A method for coding digital data for transmission over a plastic optical fiber, the method comprising the steps of:
   coding input digital data by a two-level coset coding including:
   separating the input digital data only into a first portion and a second portion of data, each with a predetermined number of bits including cyclically assigning a first predetermined number of bits to the first portion and a second predetermined number of bits to the second portion;
   coding the first portion of data with a first shortened BCH code in a first level;
   in the first level, mapping the coded first portion onto symbols of a first predefined multilevel quadrature amplitude modulation constellation and performing a first-stage lattice transformation of the mapped symbols so as to achieve coset partitioning;
   in the second level, mapping the second portion onto symbols of a second predefined multilevel quadrature amplitude modulation constellation and performing the first-stage lattice transformation of the mapped symbols;
   adding the transformed symbols from the first and the second level;
   performing a second-stage lattice transformation for achieving a zero-mean constellation;
   modulating the symbols encoded with the two-level coset coding using a multilevel pulse amplitude modulation including time multiplexing the in-phase and quadrature output of the second-stage lattice transformation in time domain,
   wherein for a block of input data bits, the first portion of data has the length of 1668 bits and the second portion has the length of 1482 bits,
   wherein the first predetermined number of bits is 4 and the second predetermined number of bits is 3, and
   the step of coding the first portion of data with the first shortened BCH codes generates codewords with 1976 bits based on 1668 input information bits.

6. An apparatus for coding digital data for transmission over a plastic optical fiber, the apparatus comprising:
   a two-level coset coder for coding input digital data by a two-level coset coding including:
   a demultiplexer for separating the input digital data only into a first portion and a second portion of data, each with a predetermined number of bits including cyclically assigning a first predetermined number of bits to the first portion and a second predetermined number of bits to the second portion;
   a BCH coder for coding the first portion of data with a first shortened BCH code in a first level;
   a first mapper for, in the first level, mapping the coded first portion onto symbols of a first predefined multilevel quadrature amplitude modulation constellation and performing a first-stage lattice transformation of the mapped symbols so as to achieve coset partitioning;
   a second mapper for, in the second level, mapping the second portion onto symbols of a second predefined multilevel quadrature amplitude modulation constellation and performing the first-stage lattice transformation of the mapped symbols;
   an adder for adding the transformed symbols from the first and the second level;
   a transformation unit for performing a second-stage lattice transformation for achieving a zero-mean constellation,
   a modulator for modulating the symbols encoded with the two-level coset coding using a multilevel pulse amplitude modulation including time multiplexing the in-phase and quadrature output of the second-stage lattice transformation in time domain, and
   wherein the first predefined multilevel quadrature amplitude modulation constellation is 16-QAM with Gray mapping whereas the second predefined multilevel quadrature amplitude modulation constellation is 8-QAM with $RZ^2$ lattice mapping.

7. The apparatus according to claim 6, wherein the first-stage lattice transformations include translation, scaling and/or rotation of a symbol, and/or the second-stage lattice transformation includes rotation of a constellation; and/or modulo operation for constraining constellation symbols to a square region in a first 2D quadrant; and/or centering and scaling.

8. The apparatus according to claim 6, wherein the multilevel pulse amplitude modulation is 16-PAM.

9. The apparatus according to claim 6, further comprising a Tomlinson-Harashima precoder for precoding the symbols modulated by the modulator.

10. An integrated circuit embodying the apparatus according to claim 6.

11. An apparatus for coding digital data for transmission over a plastic optical fiber, the apparatus comprising:
   a two-level coset coder for coding input digital data by a two-level coset coding including:
   a demultiplexer for separating the input digital data a first portion and a second portion of data, each with a predetermined number of bits including cyclically assigning a first predetermined number of bits to the first portion and a second predetermined number of bits to the second portion;
   a BCH coder for coding the first portion of data with a first shortened BCH code in a first level;
   a first mapper for, in the first level, mapping the coded first portion onto symbols of a first predefined multilevel quadrature amplitude modulation constellation and performing a first-stage lattice transformation of the mapped symbols so as to achieve coset partitioning;
   a second mapper for, in the second level, mapping the second portion onto symbols of a second predefined multilevel quadrature amplitude modulation constellation and performing the first-stage lattice transformation of the mapped symbols;
   an adder for adding the transformed symbols from the first and the second level;
   a transformation unit for performing a second-stage lattice transformation for achieving a zero-mean constellation,
   a modulator for modulating the symbols encoded with the two-level coset coding using a multilevel pulse amplitude modulation including time multiplexing the in-phase and quadrature output of the second-stage lattice transformation in time domain,
   wherein for a block of input data bits, the first portion of data has the length of 1668 bits and the second portion has the length of 1482 bits,
   wherein the first predetermined number of bits is 4 and the second predetermined number of bits is 3, and
   the BCH coder generates codewords with 1976 bits based on 1668 input information bits.

* * * * *